United States Patent [19]
Cahen et al.

[11] Patent Number: 6,043,548
[45] Date of Patent: Mar. 28, 2000

[54] SEMICONDUCTOR DEVICE WITH STABILIZED JUNCTION

[75] Inventors: David Cahen; Konstantin Gartsman, both of Rehovot; Igor Lyubomirsky, Petach-Tigwa, all of Israel

[73] Assignee: Yeda Research and Development Co., Ltd., Israel

[21] Appl. No.: 08/764,497

[22] Filed: Dec. 12, 1996

Related U.S. Application Data

[63] Continuation-in-part of application No. 08/364,183, Dec. 27, 1994, abandoned, which is a continuation-in-part of application No. 08/046,176, Apr. 14, 1993, Pat. No. 5,412,242.

[51] Int. Cl.⁷ .......................... H01L 31/0296; G05F 3/18
[52] U.S. Cl. .......................... 257/442; 257/102; 257/744; 257/614; 257/106; 438/509
[58] Field of Search .......................... 257/435, 432, 257/439, 466, 431, 188, 734, 741, 744, 735–740, 742, 743, 745, 101–103, 442, 614, 106, 603; 438/509, 95, 902

[56] References Cited

U.S. PATENT DOCUMENTS

| | | | |
|---|---|---|---|
| 3,743,553 | 7/1973 | Scott et al. | 257/614 |
| 3,886,579 | 5/1975 | Ohuchi et al. | 257/466 |
| 4,000,508 | 12/1976 | Hager et al. | 257/614 |
| 4,003,741 | 1/1977 | Gallet et al. | 420/579 |
| 4,087,293 | 5/1978 | Lancaster | 257/609 |
| 4,504,847 | 3/1985 | Nishizawa | 257/294 |
| 4,638,344 | 1/1987 | Cordwell, Jr. | 257/256 |
| 4,647,711 | 3/1987 | Basol et al. | 257/462 |
| 4,679,063 | 7/1987 | White | 257/188 |
| 4,697,202 | 9/1987 | Sher | 257/414 |
| 4,698,653 | 10/1987 | Cordwell, Jr. | 257/266 |
| 4,735,662 | 4/1988 | Szabo et al. | 257/442 |
| 4,753,684 | 6/1988 | Ondris et al. | 257/188 |
| 4,909,857 | 3/1990 | Ondris et al. | 257/184 |
| 4,948,989 | 8/1990 | Spratt | 257/106 |
| 4,960,728 | 10/1990 | Schaake et al. | 438/509 |
| 4,970,567 | 11/1990 | Ahlgren et al. | 257/442 |
| 4,972,244 | 11/1990 | Buffet et al. | 257/442 |
| 4,980,315 | 12/1990 | Einthoven et al. | 257/496 |
| 5,075,748 | 12/1991 | Hisa | 257/188 |
| 5,166,769 | 11/1992 | Einthoven et al. | 257/496 |
| 5,196,692 | 3/1993 | Arinaga et al. | 257/431 |
| 5,198,690 | 3/1993 | Kitagawa et al. | 257/200 |
| 5,229,321 | 7/1993 | Takami | 437/161 |
| 5,241,196 | 8/1993 | Ithuns et al. | 257/185 |
| 5,349,596 | 9/1994 | Molva et al. | 257/14 |
| 5,391,882 | 2/1995 | Rhiger | 257/188 |
| 5,459,321 | 10/1995 | Bartoli et al. | 257/290 |
| 5,670,796 | 9/1997 | Nishibayashi et al. | 257/28 |

OTHER PUBLICATIONS

Tsyntsyura et al., "Preparation and Same Properties of P—N Junctions Based on $Ln_x Hg_{1-x} Te$," Soviet Physics—Semiconductors, vol. 4, No. 8, Feb. 1971.

*Primary Examiner*—Alexander Oscar Williams
*Attorney, Agent, or Firm*—Evenson, McKeown, Edwards & Lenahan, P.L.L.C.

[57] ABSTRACT

Self stabilizing concentration profiles are achieved in solids. More particularly, semiconductor devices are made from n- or p-type mercury cadmium telluride (MCT) of the general formula $Hg_x Cd_{1-x} Te$ where x=0.2 to 0.5 and n- or p-type zinc mercury telluride (ZMT) of the general formula $Zn_x Hg_{1-x} Te$ where x=0.4 to 0.6. Silver, incorporated as a doping impurity or applied as an evaporated spot electromigrated within the MCT or ZMT to create one or more p-n junctions, usually under the influence of a pulsed positive bias. The resulting concentration profiles of silver and opposing internal electric fields of the p-n junctions achieve a balancing equilibrium that preserves and maintains the stability of the concentration profiles. For a specific telluride composition, $Hg_{0.3}Cd_{0.7}Te$, indium is the n-type dopant of choice.

23 Claims, 20 Drawing Sheets

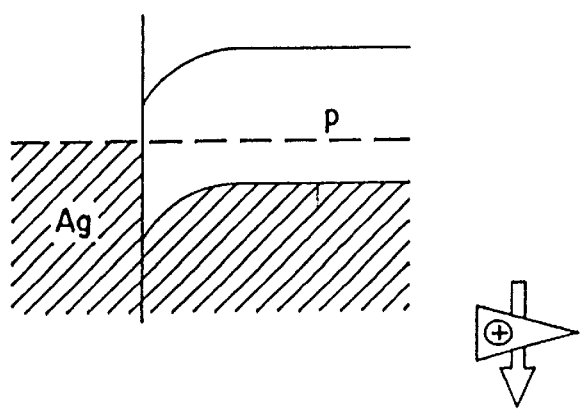
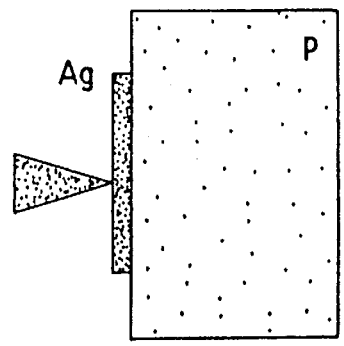
Fig. 2a-1
Fig. 2a-2
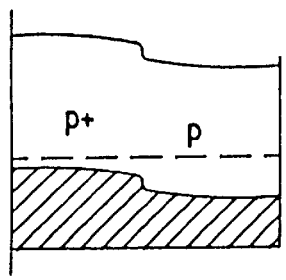
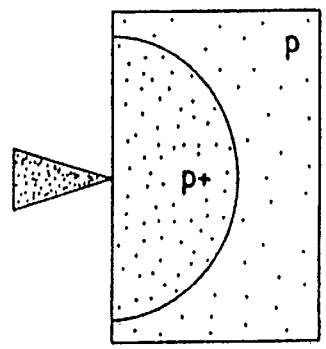
Fig. 2b-1
Fig. 2b-2
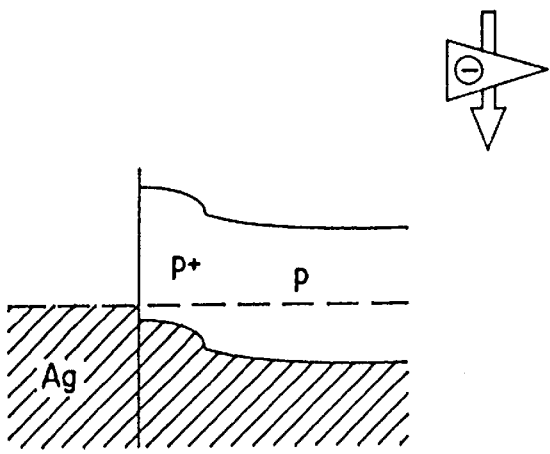
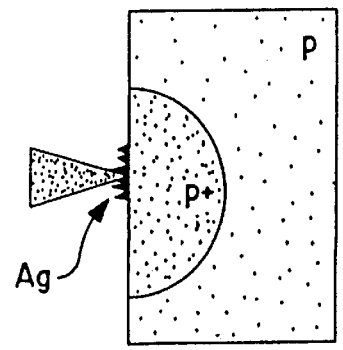
Band Diagram
Fig. 2c-1
Scheme
Fig. 2c-2

50 μm scheme

50 μm

SEMICONDUCTOR DEVICE WITH STABILIZED JUNCTION

This application is a continuation-in-part of U.S. application Ser. No. 08/364,183, filed Dec. 27, 1994, now abandoned, which is a continuation-in-part of U.S. application Ser. No. 08/046,176, filed Apr. 14, 1993, now U.S. Pat. No. 5,412,242.

FIELD OF INVENTION

The present invention relates to semiconductor devices containing an electrically active dopant, said semiconductor devices being characterized by self stabilized junctions.

BACKGROUND OF INVENTION

Most modern optoelectronic and electro-optic devices are based on materials with local inhomogeneity in their chemical composition (e.g. semiconductor devices, optoelectronic wave mixers, waveguides). This is so, because the presence of chemical inhomogeneity is obligatory to get the required properties. Creation of the chemical inhomogeneity results in the creation of a gradient of chemical potential of atomic species. Therefore just after its creation the concentration gradient starts to relax through the diffusion of the inhomogeneously distributed species. As a result of this the device, made in this way, can be used only during a time much smaller than the relaxation time. The way to prolong the life time of the device is to slow down the diffusion of the species that gives rise to the chemical inhomogeneity. In this case the problem is how to put them in. Normally this is done at high temperatures. This kind of inhomogeneity is stable due to kinetic reasons.

SUMMARY OF INVENTION

We have found that is possible to get thermodynamically stable concentration profiles (i.e. concentration gradients that correspond to states of minimum of thermodynamic potential). To get this we use the fact that diffusion of electrically active species in semiconductors is accompanied by the creation of an internal electric field. Is it possible to find a situation in which the flux of particles due to the concentration gradient is compensated by the flux due to electromigration in opposite direction? Such situation will be stable in time (zero electrochemical potential gradient). There are some systems where the flux of particles due to the concentration gradient is in directions opposite to the flux due to electromigration. These systems are: Zn in GaAs, Cu in Ge, Au and Pt in Si. In all these cases the self-created electric field retards the diffusion. However, up til now none of these systems of concentration gradient, stable in time, at temperatures where appreciable diffusion occurs, was achieved.

a. Terminology

An inhomogeneous distribution of electrically active defects/impurities in semiconductors results in an internal electric field. In diffusion of such electrically charged species, $c_i$, the total flux of particles is the sum of the fluxes produced by the concentration gradient and by the built-in electric field.

The, flux $j_{diff}$ (in $cm^{-2}sec^{-1}$), due to concentration gradient $$\frac{\partial c}{\partial x}$$

may be expressed by:

$$j_{diff} = -D_k \frac{\partial c}{\partial x} \quad (2.1)$$

where $D_k$ is the chemical diffusion coefficient (in $cm^2sec^{-1}$) related to the self diffusion coefficient, D (diffusion coefficient at small concentration) as $$D_k = D[TF] = D\frac{\partial \ln a}{\partial \ln c} \quad (2.2)$$

Here a is activity and [TF] is the thermodynamic factor that takes into account deviation of the system from ideal behavior. The flux due to electromigration, $j_{e1}$, is $$j_{e1} = \mu c E \quad (2.3)$$

Where E is the strength of the electric field (V/cm), $\mu$ is the electrical mobility ($cm^2$(Vsec)), related to the self diffusion coefficient by the Nernst-Einstein equation, if the mechanisms for diffusion and electromigration are identical $$\mu = \frac{De}{kT}z \quad (2.3)$$

z is the charge of the particle in units of electron charge(e). From (2.1)–(2.3) the total flux, j, is:

$$j = -D\left([TF]\frac{\partial c}{\partial x} - \frac{ze}{RT}cE\right) \quad (2.4)$$

To predict the evolution of concentration profile of electrically charged species it is necessary to know not only the changing diffusion coefficient of these species but also the distribution of the internal electric field. The explicit dependence of the electric field on the concentration of charged species is known only for some particular cases. The internal field is given by [1]

$$E = \frac{kT}{e}\left(\frac{1}{p}\frac{\partial p}{\partial x} + \frac{1}{\gamma_p}\frac{\partial \gamma_p}{\partial x}\right) \quad (2.5)$$

where p is hole concentration, $\gamma_p$ is coefficient of hole activity (the same can be expressed through the electron concentration as well). For a nondegenerate semiconductor $\gamma_p$ is constant and very close to 1. That's why the second term then can be omitted.

b. Diffusion of Non-Amphoteric Dopants (Dopants are Either Donors or Acceptors)

Let's consider dopant diffusion in the self-created built-in electric field. We can distinguish two cases, with strong space charge and without it.

i. Diffusion in the Absence of a Space Charge

In the case where the density of the space charge in a semiconductor is much smaller than the concentration of dopants ($n$-$n^+$ or $p$-$p^+$ graded junction), any volume of the semiconductor can be considered as neutral and the equilibrium between the concentrations of donors (1), acceptors (A), electrons(n) and holes(p) can be described as: $p+D^+ = n+A^-$ [2]. In absence of an electric current the product of electron and hole concentration is $pn=K^i$, where $K^i$ is the intrinsic carrier constant and a function of temperature. Therefore $$p = \frac{1}{2}\left(A^- - D^+ + \sqrt{(A^- - D^+)^2 + 4K^1}\right) \quad (2.6)$$

We will now consider some special cases.

a. The carrier concentration due to doping is much larger than the intrinsic carrier concentration. For this case substitution of (2.6) in (2.5) gives:

$$E = \frac{kT}{e} \frac{1}{|A^- - D^+|} \frac{\partial (A^- - D^+)}{\partial x}$$

and substitution of (2.7) in (2.4) gives $$j = -D\left([TF]\frac{\partial c}{\partial x} - c\frac{z}{|A^- - D^+|}\frac{\partial (A^- - D^+)}{\partial x}\right) \quad (z = \pm 1) \quad (2.8) \text{ [ref. 3]}$$

If only one dopant is present at concentration $c(A^-–D'=c\beta$, $\beta$ is degree of ionization) and the system is close to ideal ([TF]=1) (2.8) becomes:

$$j = -2D\frac{\partial c}{\partial x} \quad (2.9)$$

In this particular case the effective diffusion coefficient is twice as large as the self diffusion and the degree of dopant ionization does not affect the effective diffusion coefficient.

b) If the concentration of intrinsic carriers is comparable with the carrier concentration produced by dopants, the effective diffusion coefficient is proportional to the self diffusion coefficient as:

$$D_{eff} = (1 + \alpha)D, \quad \text{where } \alpha = c/\sqrt{c^2 + K^1}.$$

z is positive for donors and negative for acceptors. Therefore the direction of a diffusion flux always coincides with that of electromigration. In the cases a) and b) the only possible solution of the equation j=0 is $$\frac{\partial c}{\partial x} = 0.$$

ii. Diffusion in the Presence of a Space Charge

If the space charge is not negligibly small (as in cases of p-n junction or n-n+ abrupt junctions) the equation $p+D^+ = n+A^-$ does not hold. The electric field for this case can not be obtained by formula (2.7).

Let's consider a graded p-n junction. The highest field in the junction can be expressed as:

$$E_{max} = \frac{ed^2}{2\varepsilon\varepsilon_o}\beta\frac{\partial c}{\partial x} \quad (2.10) \text{ [ref. 2]}$$

$\beta$ is $10^{-1}$ for activation energy 60 meV, d is the thickness of the junction (of the order of $10^{-4}$ cm usually). The flux is $$j = -D\left([TF] + \frac{e^2}{kT\varepsilon_o}\left(\frac{\beta cd^2}{2\varepsilon}\right)\right)\frac{\partial c}{\partial x}$$

For $c=10^{17}$ one could get $$j = -D([TF] + 350)\frac{\partial c}{\partial x}.$$

The electric migration term is normally orders of magnitude larger than the diffusion term. Cases 2.2.1 and 2.2.2 show that if the dopant is not amphoteric (i.e. it can be present in crystal only as a donor or as an acceptor) concentration profile tends to flatten until concentration gradient will exist.

C. Diffusion of Amphoteric Dopants

In the previous cases the direction of the diffusion flux always coincided with that of electromigration. Let us consider the situation when the diffusion flux and the flux due to electromigration are in opposite directions. To fulfill this it is enough that the dopant acts as a donor but diffuses as an acceptor or vice versa. Such a situation exists in the dissociative diffusion mechanism (so called Frank-Turnbull diffusion [1]). In this case the self-created field retards the diffusion and there can be conditions when the fluxes due to both these factors are equal. It corresponds to zero total flux and to a concentration gradient that is stable in time.

Let us consider the conditions of equilibrium in such a system. The condition for zero flux is $$j = -D[TF]\frac{\partial c}{\partial x} + \frac{De}{kT}cE = 0 \quad (2.12)$$

Hence, for a stable profile of such type to exist, the electric field has to be described as follows, from (2.12):

$$E_{st} = [TF]\frac{kT}{e}\frac{1}{c}\frac{\partial c}{\partial x} \quad (2.13)$$

Equation (2.13) gives a criterion for possible stability of a junction.

There are some systems where the dopant acts as a donor but diffuses as an acceptor depending on its site in the crystal (Zn in GaAs[1], li in ZnTe[5], Cu in Ge and Au in Si[6], [7], [8], [9]). The best investigated system is Zn in GaAs at 400–800° C. The major part of Zn substitutes for Ga and acts as an acceptor. Zni is also present and acts as a donor. These two forms are in equilibrium according to $Zn_i + V_{Ga}^* + 3e^- \leftrightarrows Zn_{Ga}^1$. Each form has its own diffusion coefficient and contributes to creation of the internal field. The contribution of Zni to the internal electric field is negligibly small, due to the fact that $[Zn]<<[Zn_{Ga}]$. Therefore the electric field is directed from a region with low [Zn] (+) to a region with high [Zn] (–). Because $Zn_i$ diffuses much faster than $Zn_{Ga}$ electro-migration of $Zn_i$ produces a strong flux in the direction, opposite to that of diffusion due to the concentration gradient. As a result the total flux is strongly retarded.

The foregoing has led to the development of an inventive system that achieves the objects of the present invention, namely, to achieve the self stabilization of a concentration profile in a solid and more particularly, to the development of semiconductor devices characterized by self stabilized junctions and to method for achieving same. These and other objects of the present invention are accomplished by selection of components and control of process parameters in a system, in which diffusion flux and electric migration can be in opposite directions and compensate one another.

The present invention thus provides a semiconductor device comprising a body of a semiconductor material being of one of n- or p-type selected from the group consisting of GaAs, InP, $Hg_xCd_{1-x}Te$, wherein x is 0.19–0.29, 0.31–0.41, $Zn_xHg_{1-x}Te$ wherein x is 0.4–0.6, and $A_xB_{1-x}C$ wherein A and B are different elements selected from the group consisting of Al, Ga and In, C is As or Sb and x is from 0 to 1, containing an electrically active dopant selected from the group consisting of Ag, Be, Cd and Zn, said dopant defining in said body of said semiconductor material a stable p-n junction having a stable concentration gradient in equilibrium with an internal electric field inherently created by the p-n junction, as a result of which the electrical properties of the said device are self-restored after being degraded by an external perturbation.

The external perturbation may be selected from application of forward electrical bias, heating at a temperature above that used for preparing the doped body, illumination with photons of energy higher than the bandgap or by exposure to a beam of energetic particles, and wherein self-restoration of said electric properties of the device occurs at a temperature below the temperature needed for the thermal perturbation, where the intrinsic electronic carrier concentration is at least two orders of magnitude below that of the electrically active dopants.

According to the invention the junction should be able to restore its electrical properties by itself after being perturbed electrically, thermally or by illumination.

The self-restoration of the electrical properties is the consequence of the fact that the spatial distribution of the dopant has a preferred shape defined by: (i) the properties of the dopant, (ii) the properties of the semiconductor, and (iii) the temperature.

The spatial dopant distribution tends to reestablish the preferred shape after being perturbed by any of the means mentioned above. The reestablished preferred distribution may be either on the same place, this being the case of fully stable junctions, or with some shift with respect to the original position, this being the case of extra kinetically stabilized junction, which is a preferred embodiment of the invention.

The electrically active dopant used in the semiconductor device of the present invention should present the following properties:

a) The dopant diffuses by a dissociative mechanism, i.e. at the temperature of self-restoration of the electrical properties of the semiconductor junction the dopant is present both as donor and as acceptor.

b) Local equilibrium between both donor and acceptor forms is established during a time $\tau_{eq}$ much smaller than the diffusion time in a junction $\tau_D$, i.e. $\tau_{eq} \ll \tau_D$. One could write $\tau_{eq} = C\ (1/k_{D \to A} + 1/K_{A \to D})$ and, $\tau_D = \mathcal{L}^2/D$, where $\tau_{eq}$ is the characteristic time for the $D \leftrightarrows A'$ expressed through the kinetic constants of forward and reverse direction. $\tau_D$ is the characteristic time of diffusion in a junction, $\mathcal{L}$ is the length of the junction and normally is ~$\mu$m or less.

c) The diffusion coefficient of one form of the dopant is greater than that of the other form.

d) The carrier concentration produced by the slower diffusing form is much larger than the carrier concentration produced by the faster one. This can be achieved in two ways: by difference of ionization energy or by presence of the slower form in much larger concentration than the faster one.

e) The concentration of dopants is lower than the solubility limit (to avoid precipitation) but higher than the intrinsic carrier concentration at the given temperature.

f) All requirements a–e are fulfilled at low temperatures in order to maintain a concentration of intrinsic carriers that is much smaller than the carrier concentration produced by ionization of diffusing species. Otherwise, no strong space charge can be achieved. Naturally the exact definition of "low temperature" depends on the band structure of the semiconductor.

Regarding the properties of the semiconductor, it is preferred that at the temperature of self-restoration of the electrical properties of the semiconductor junction, the semiconductor has a net intrinsic carrier concentration at least 3 orders of magnitude less than the carrier concentration at which the semiconductor starts to be degenerate.

One example of semiconductor-dopant combination according to the invention is Ag-doped $Hg_xCd_{1-x}Te$, wherein x is 0.19–0.3, 0.31–0.41, prepared by heating $Hg_xCd_{1-x}Te$ with Ag for 1–15 days at about 105–160° C., said external thermal perturbation is applied by heating for about 10–30 min at about 180–200° C. and self-restoration occurs by annealing for 0.5–100 days at about 20–80° C. Other examples are Zn- or Be-doped InP, prepared by heating InP with Zn or Be for 10–60 min at about 540–600° C., said external thermal perturbation is applied by heating for about 10–30 min at about 650–680° C., and self-restoration occurs by annealing for 2–5 days at about 400–440° C. Still further examples are Zn-, Cd- or Be-doped GaAs, prepared by heating GaAs with Zn, Cd or Be for 30–60 min at about 600–700° C., said external thermal perturbation is applied by heating for about 20–40 min at about 700–800° C., and self-restoration occurs by annealing for 3–5 days at about 450–550° C.

In a further embodiment of the invention, the semiconductor device comprises a body of a semiconductor material being of one of n- or p-type selected from the group consisting of GaAs, InP, $Hg_xCd_{1-x}Te$, wherein x is 0.19–0.3, 0.31–0.41, $Zn_xHg_{1-x}Te$ wherein x is 0.4–0.6, and $A_xB_{1-x}C$ wherein A and B are different elements selected from the group consisting of Al, Ga and In, C is As or Sb and x is from 0 to 1, containing an electrically active dopant that creates an internal electric field selected from the group consisting of Ag, Be, Cd and Zn, said device being characterized by a stable p-n junction maintained by suppression of diffusion of said electrically active dopant by said internal electric field, and wherein self-restoration of the electrical properties of the said device occurs after being degraded by an external electrical or thermal perturbation or by perturbation with a photon or other particle beam. In a preferred embodiment, said external perturbation is thermal, heating occurs at a temperature above that used for preparing the doped semiconductor body, and self-restoration of said electric properties of the device occurs at a temperature below the temperature needed for the thermal perturbation, where the intrinsic electronic carrier concentration is at least two orders of magnitude below that of the electrically active dopants.

The above and other objects and advantages of the present invention will be come more readily apparent from the following detailed description of preferred embodiments of the present invention when taken in conjunction with the drawings.

DESCRIPTION OF DRAWINGS

FIGS. 1a-1 and 1a-2 show the original EDS spectrum and EBIC image;

FIGS. 1b-1 and 1b-2 show original EDS spectrum and EBIC image after the application of +18V at 0.5 ma for 8 min.; and FIGS. 1c-1 and 1c-2 show dendrites obtained by application of negative bias −3V at 0.8 mA for 30 min.

FIGS. 2a-1–2c-2 show schematically cross-section and band diagram of introduction and reduction of silver in p-type MCT. FIGS. 2a-1 and 2a-2 show original spot;

FIGS. 2b-1 and 2b-2 show the spot after application of positive bias; and

FIGS. 2c-1 and 2c-2 show silver dendrite formation by application of negative bias.

FIG. 3a shows scheme of the measurements, and

FIG. 3b shows shape of the applied positive bias.

FIG. 5a-1 and FIGS. 5b-1–5d-2 show graphically and schematically silver migration in n-type MCT, thermoelectric power data, EBIC images and schematic interpretation (top view). FIGS. 5b-1 and 5b-2 show initial spot;

FIGS. 5c-1 and 5c-2 show the spot after 9 hours of positive bias; and

FIGS. 5d-1 and 5d-2 show the spot 24 hours after the bias application was stopped.

FIGS. 6a-1–6c-2 show schematically cross-section and band diagram of silver migration in n-type MCT. FIGS. 6a-1 and 6a-2 show original spot;

FIGS. 6b-1 and 6b-2 show the same after application of positive bias; and

FIGS. 6c-1 and 6c-2 show the situation 24 hours later.

FIGS. 7a-1–7c-2 show schematically electromigration of silver in p- MCT doped with indium and with Silver, EBIC Images (top views) and schematic top view. FIGS. 7a-1 and 7a-2 show original spot;

FIGS. 7b-1 and 7b-2 show the spot after the application of the positive bias 25V, 0.3 mA, 30 min.; and FIGS. 7c-1 and 7c-2 show the spot after one week (mixed picture secondary electron+EBIC image).

FIGS. 8a-1–8c-2 show schematically crosssection and band diagrams of silver migration in MCT originally doped by Indium to n-type and homogeneously type converted by Silver to p-type. FIGS. 8a-1 and 8a-2 show original spot;

FIGS. 8b-1 and 8b-2 show the spot after the application of positive bias and creation of n-type area; and FIGS. 8c-1 and 8c-2 show the spot one week after application of positive bias.

FIG. 10 shows the shape of a doping file.

DETAILED DESCRIPTION OF PREFERRED EMBODIMENTS

Figures 1, 1A:
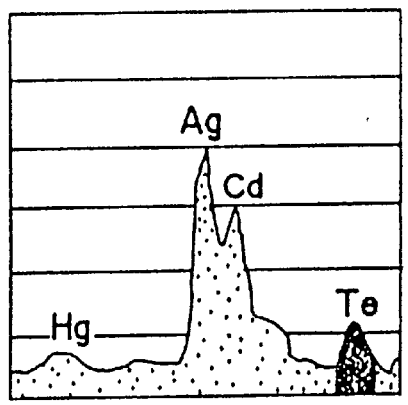
FIGS. 1a-1–1c-2 illustrate Energy Dispersive X-ray Fluorescence Spectroscopy (EDS) (2.0–4.0 keV) spectra and Electron Beam Induced Current (EBIC) (topview) images showing the effect of electromigration of silver in p-$Hg_{0.3}Cd_{0.7}Te$.

Referring now to the drawing in detail, a particular system that satisfies the requirements mentioned is Ag-doped Mercury Cadmium Telluride (MCT). At room temperature systems with low Hg content (<50 at % HgTe) are of interest. CdTe and HgTe possess a zinc blende structure and form a solid quasi-ideal solution over the whole concentration range of $Hg_xCd_{1-x}Te$. Electrical properties vary from semi-metallic for HgTe ($E_g$=−0.115 eV @ 300 K) to semiconducting for pure CdTe (Eg=1.53 eV @ 300 K). The electrical properties of MCT are determined by active impurities and native defects [12, 13]. The most important native disorder in MCT is the action $[Hg_{Hg}]\rightarrow Hg_i+V_{Hg}$. $V_{Hg}$ usually determine p-type behavior of as-grown MCT while $Hg_i$ are electrically inactive. Baking at Hg overpressure eliminates $V_{Hg}$ and results in conversion to n type [14].

Another very important feature of MCT is that the majority of foreign impurities creates substitutional defects. Monovalent metals act on a Hg site as acceptors, trivalent metals act as donors. Data about diffusion in MCT at room temperature are limited. Talasek [15] observed room temperature diffusion of Cu into MCT and type conversion. Astles and Tregilgas [16], [17] observed room temperature surface impurity segregation.

The diffusion profile of Ag, Cu, Au and Hg [18] in MCT contains usually two components: a fast and a slow one. A dissociative mechanism $[Me_{Hg}] \rightarrow Me_i + V_{Hg}$ (Me=Ag, Cu, Au, Hg) [16, 19, 20] has been assumed to explain this. At low temperature most of the Ag is present as $Ag_{Hg}$ which is an acceptor. The slow diffusion component is associated with the vacancy diffusion mechanism. The fast component is assigned to diffusion by the dissociative mechanism. It was confirmed by the fact that increasing the Hg overpressure decreases the slow diffusion component much more than the fast one [18, 21]. It fits the theoretical models developed [22].

The experimental methods and instrumentation which were used to obtain the results of the present invention are as follows.

Preliminary experiments were performed by the following techniques:

a) Scanning Electron Microscopy: A Philips 515 Scanning Electron Microscope (SEM) was used in modes:
  1. Secondary electron imaging (SE),
  2. Back scattered electron imaging (BS),
  3. Electron Beam Induced Current (EBIC) measurement and imaging.
  4. Energy Dispersive X-ray Fluorescence Spectroscopy (EDS) measurements.

The EBIC mode can reveal presence and direction of electric fields in a sample. This mode gives direct information about the location, the direction and the relative value of the internal electric field. The measurement of the electric field direction in a Schottky barrier provides a direct indication of the conductivity type of the semiconductor.

EDS gives information about the concentration of elements with a sensitivity of about 1–2.5 at. %. In order to get information about changes of composition of thin films on the surface of the samples, low acceleration voltages (<15 kV, instead of the normal 25 or 30 kV) were used. However even in this case the analyzed area is about 100 nm in depth. That is why EDS data can show only rather larger changes.

b) A four-probe, controlled atmosphere micro manipulator (MP) with controller for voltage application and Light Induced Current (LBIC) System.

The manipulator is placed in a chamber evacuated down to a pressure of less than 20 mTorr. Electric connections are provided by high voltage cables. Contact needles were prepared electrochemically from baked tungsten wire with sharpness of about 2 µm.

c) Microprobe Seebeck (thermoelectric power) coefficient measurements.

One of the arms of the MP was modified to perform local Seebeck coefficient measurements. The setup allows to measure changes of Seebeck coefficient in situ before and after bias application.

d) Measurements of specific resistance, carrier concentration and mobility were performed by the Hall method using the Van der Pauw technique in a magnetic field of 2.1 T at room temperature.

Investigations of Silver Migration in $Hg_{0.3}Cd_{0.7}Te$ (MCT30). Both n- and p-MCT were used. The band gap of the material is about 0.9 eV.

The scheme of the experiment was as follows: samples of MCT30 were polished chemo-mechanically, using first a 5% (v/v) and then a 1 % (v/v) $Br_2$/ethylene glycol solution. Subsequently 40 nm thick, 50 µm diameter Ag spots were evaporated on their front surface. A large area back contact was provided by silver conductive paint. Voltage was applied between the spot to be treated and the back contact.

a) Fast Reversible Electric Field Injection of Silver in P-Type Material

As grown p-MCT30 with specific resistance of 35 OHM-cm, hole concentration of $4.10^{15} cm^{-3}$, mobility of 40 $cm^2(V \cdot s)$ was used as a sample. The time between chemo-mechanical polishing and evaporation of Ag affects the spontaneous diffusion of the Ag into the sample. If Ag spots are evaporated just after polishing, then after 20 hours EDS shows a decrease of [Ag] to below background level. No EBIC signal was observed in this case (28 hrs after evaporation). Application of negative bias results in reduction of Ag on the sample surface in the form of dendrites. Ag dendrites can Drecisitate us to 30 µm away from the original spot.

It is believed, silver is a p-dopant to MCT. In spite of this fact silver moves under the influence of an electric field as a positively charged particle. The electric field of the Schottky barrier is directed into the sample. It suffices to oxidize $Ag+, Ag \rightarrow Ag^+ + e^-$ and to drive ionized Ag into the sample, making it heavily p-doped $Ag_i + V_{Hg} + 2e^- = Ag_{Hg}$. After that $Ag_i$ diffuses into sample and distributes homogeneously. Therefore no EBIC contrast is observed.

Figures 1, 1B:
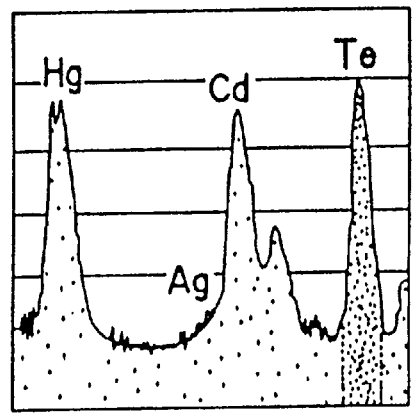
Figures 1, 1C:
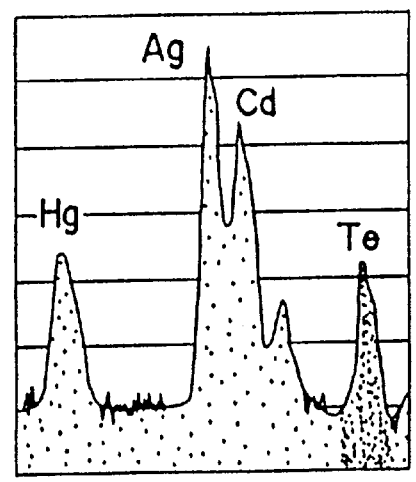
Figures 1, 1A, 2:
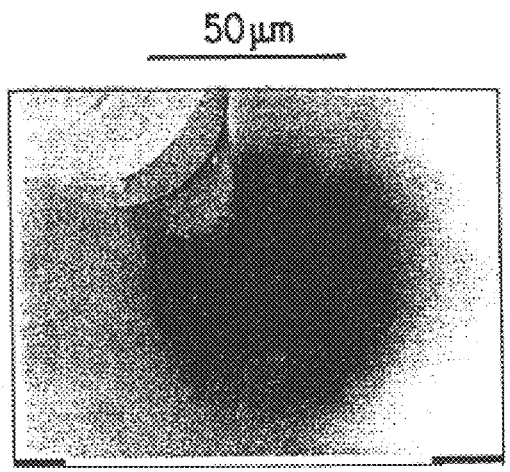
Figures 1, 1B, 2:
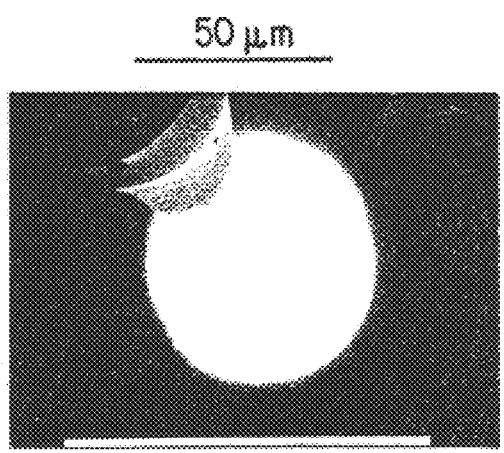
Figures 1, 1C, 2:
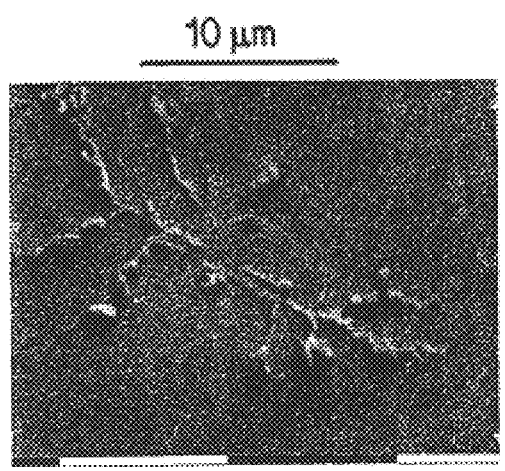

Ag spots evaporated >4 hrs after polishing do not show any change of the [Ag] on the surface during 4 days of observation according to EDS (FIG. 1a). Application of +18V bias (I=0.5 mA) for 8 min. to the Ag spot leads to disappearance of Ag, according to EDS (FIG. 1b). Simultaneously a change in EBIC signal is observed. Originally a negative EBIC current was obtained from the spot, corresponding to the electric field produced by the Schottky barrier and directed from the contact into the bulk of the sample (FIG. 1a). After application of positive bias, the electric field changed direction and the area of the internal field increased in size (FIG. 1b). Application of negative bias after the positive bias results in precipitation of silver dendrites on the surface (FIG. 1c). No traces of chemical decomposition, mechanical or thermal damage were observed. Application of positive bias in the range of 7–45 V to the Ag spots results in disappearance of Ag from the surface. The time necessary for this varies from 2 min. (45V) to 4 hours (7V). In all cases Ag can be precipitated back onto the surface by application of negative bias. It is believed that, application of positive bias results in the oxidation $Ag \rightarrow Ag^+ + e^-$ and subsequent migration of silver (as ion) into the vicinity of the biased spot. This produces a heavily doped $p_+$ area just under the spot which shows white EBIC contrast corresponding to a $p$-$p_+$ junction. Application of negative bias moves Ag back to the surface, reduces it and leads to dendrite formation (FIG. 2). The fact that spontaneous diffusion is not observed if the time between polishing and Ag evaporation is longer, may be due to the fact that $Br_2$/Ethylene glycol treatment leaves some monolayers of pure Te on the surface, which oxidize in about two hours [23], [24], [25]. This layer of $TeO_2$ slows spontaneous Ag diffusion.

b) Electromigration of Silver into N-Type MCT

In doped n-MCT30 with specific resistance of 5.3 Ohm·cm, electron concentration of $3 \cdot 10^{15} cm^{-3}$ and electron mobility of 400 $cm^2/(V \cdot s)$ was used as sample.

No experimental conditions were found for spontaneous diffusion of Ag into n-MCT for depths beyond EDS resolution. No change of EBIC signal was observed during 10 days of observation.

Figure 3A:
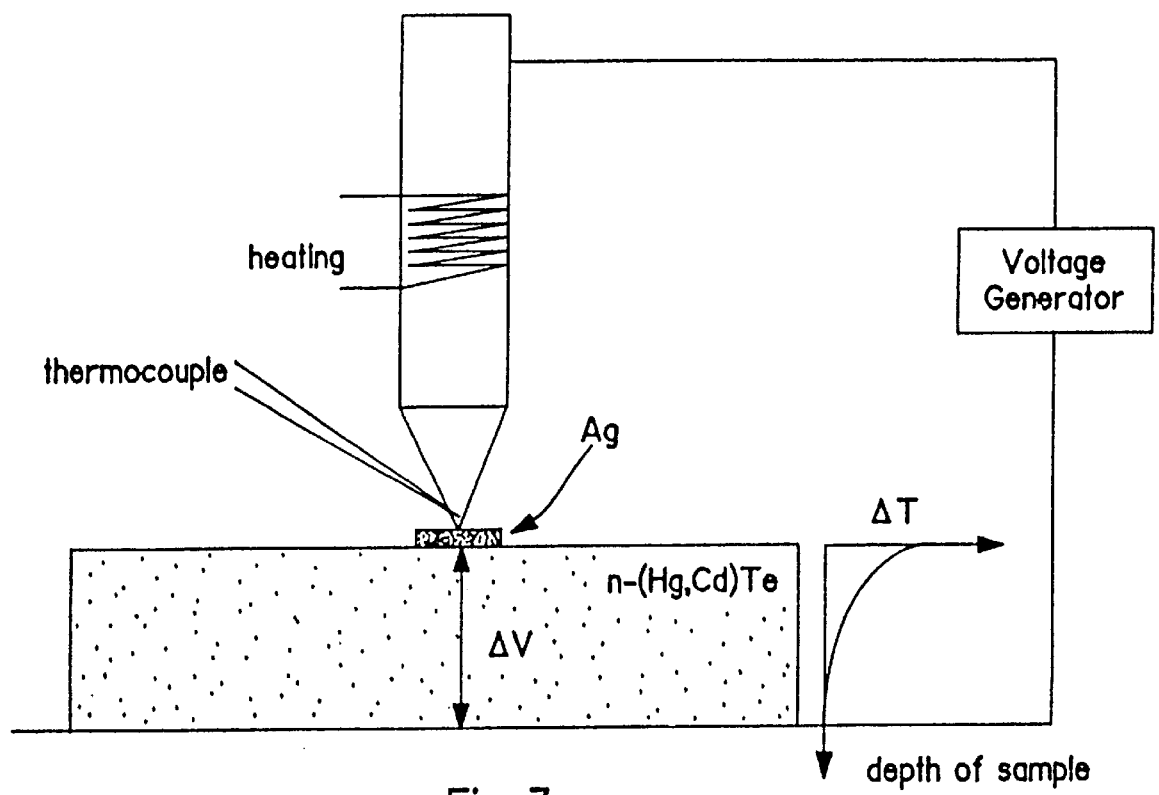
FIGS. 3a and 3b show schematically the setup for thermoelectric power measurements.
Figure 3B:
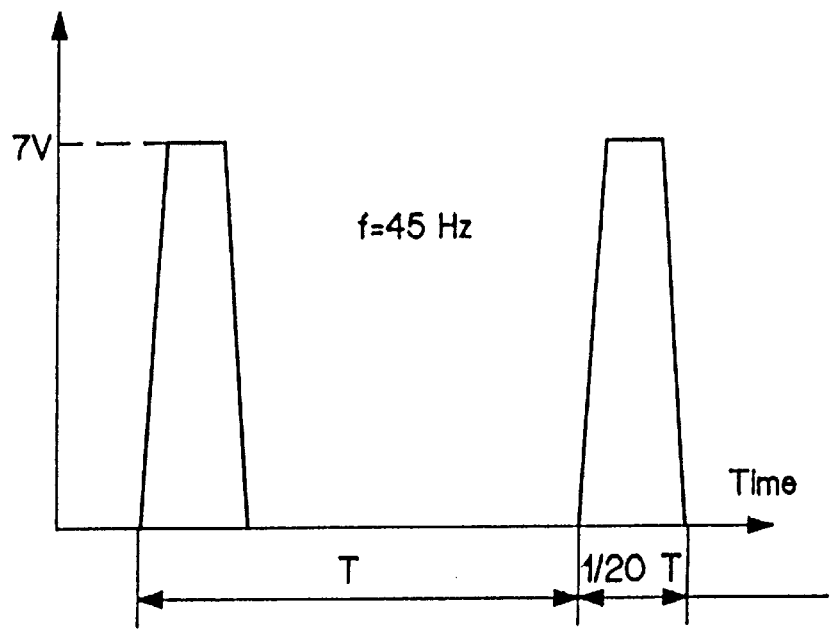
Figure 4:
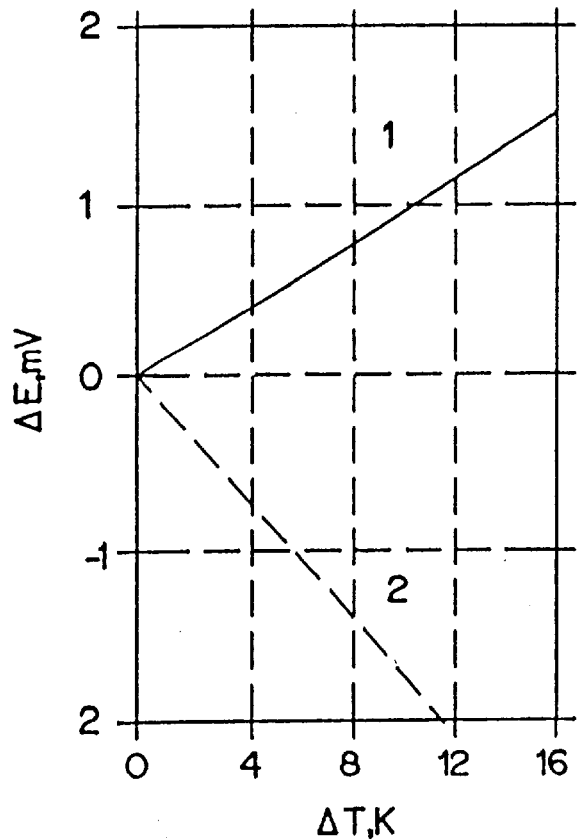
FIG. 4 shows graphically Thermoelectric power, $\Delta V$, versus the temperature difference, $\Delta T$, before and after silver migration in n-type MCT, the thermoelectric power measurements incorporated in solid line 1 for original spot; and dashed line 2 for spot after 4 hours of positive bias; the second line is straight i.e. indicates homogeneity of doping; in this case no change in the thermoelectric power was observed during 48 hours after the application of the positive bias was stopped.
Figures 1, 5A:
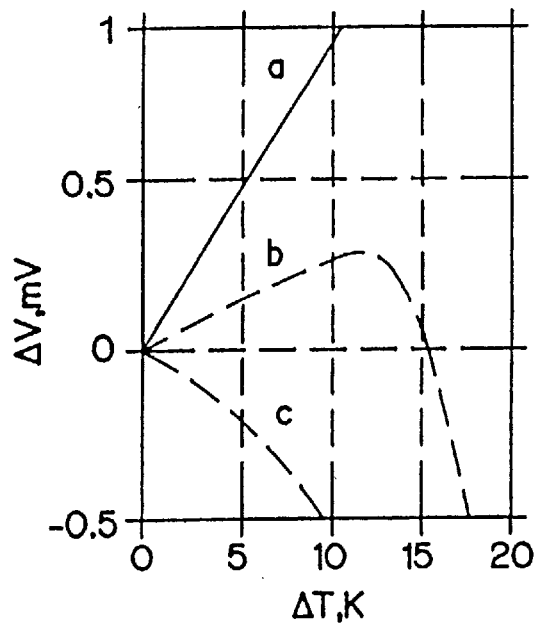
Figures 1, 5B:
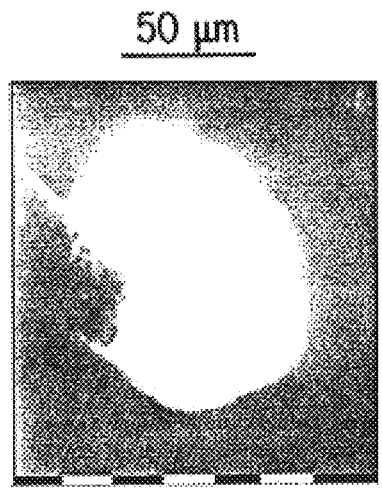
Figures 1, 5C:
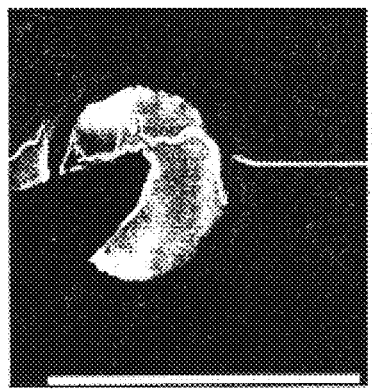
Figures 1, 5D:
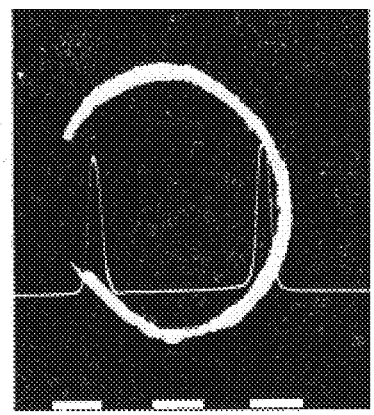
Figures 2, 5B:
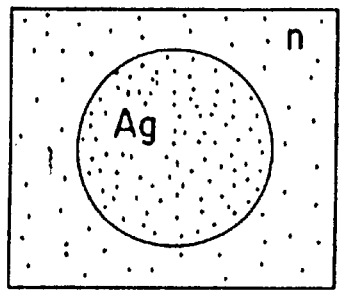
Figures 2, 5C:
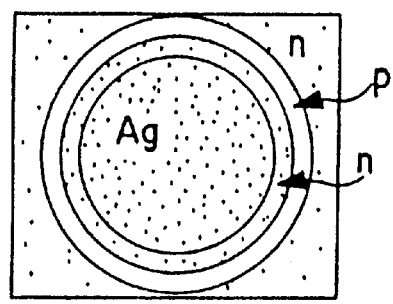
Figures 2, 5D:
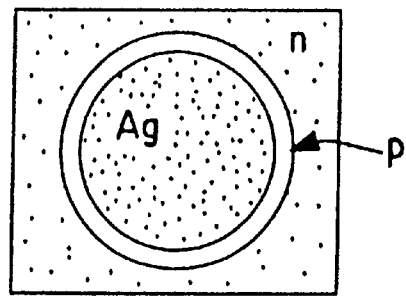
Figures 1, 6A:
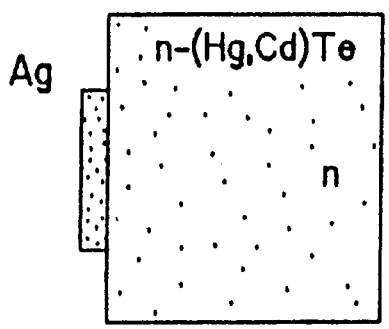
Figures 2, 6A:
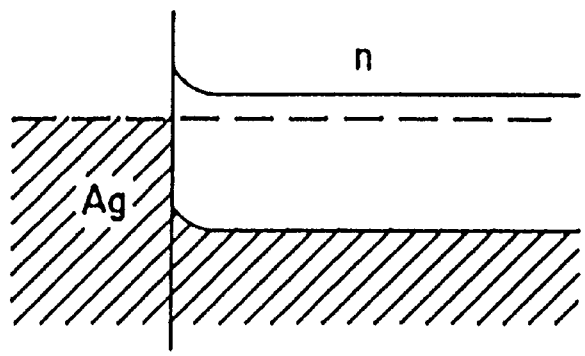
Figures 1, 6B:
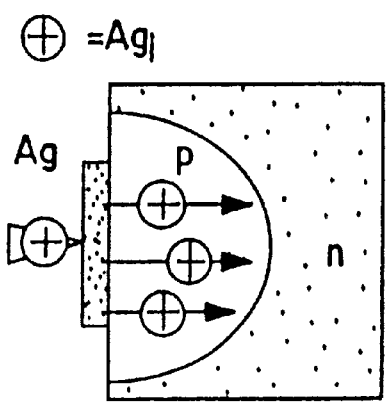
Figures 2, 6B:
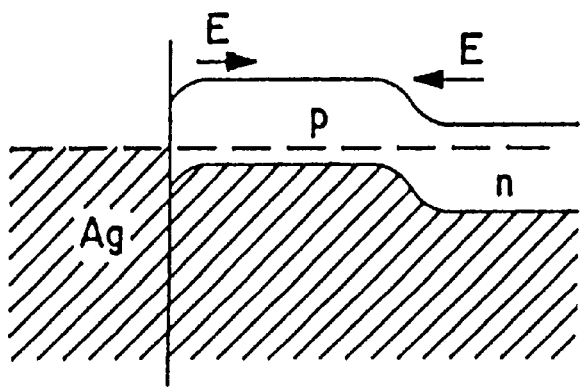
Figures 1, 6C:
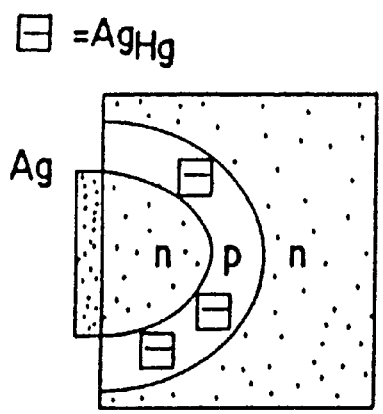
Figures 2, 6C:
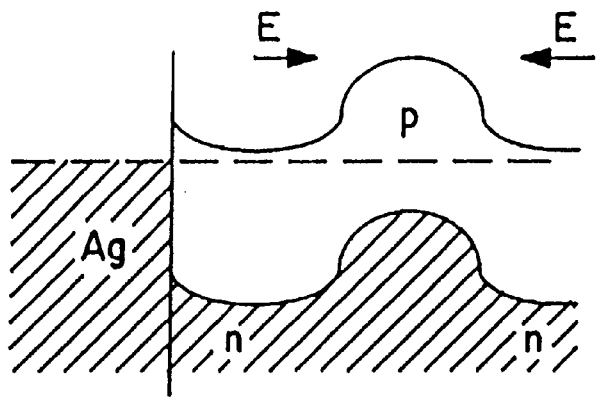

Bias in the form of positive pulses (FIG. 3b) was applied in the micro-manipulator. Seebeck measurements were performed at intervals between bias applications and 24 hours afterward (FIG. 3a). The sign of the Seebeck coefficient (FIGS. 2, 5) shows a change of the conductivity type from n to p. If the application of positive bias is stopped just after type conversion, Seebeck coefficient measurements show formation of a stable p-type area (FIG. 4), which is confirmed by EBIC measurements, performed 48 hrs after bias application. Further application of positive bias results in formation of an inhomogeneous p-type area (the $\Delta V$ vs. $\Delta T$ curve becomes nonlinear; cf. (FIG. 5b). Then the system evolves by itself into an n-p-n structure, as indicated both by Seebeck coefficient measurements and EBIC.

It is believed that the direction of the electric field of the Schottky barrier stops spontaneous Ag diffusion into n-MCT. Possibly it occurs up till a very small depth, in which case further diffusion is stopped due to the strong internal electric field of the shallow p-n junction, created by the initial diffusion. Application of positive bias results in Ag diffusion into the material and formation of a p-n junction. If application of bias is stopped just after type conversion, the situation is stable because Ag diffusion into the bulk is stopped by the internal electric field directed toward the Ag spot. Further application of positive bias results in Ag out-diffusion from the spot and creation of an n-type region. The reason for this is the following. If in the p-type area a region with smaller concentration of Ag is created, than the voltage drop will be preferentially in this place. It results in Ag out-diffusion from this region and creation of a small n-type region. In the n-type region the internal electric field drives Ag out. Further evolution of the system occurs due to movement of Ag under the influence of the built-in field (FIG. 6).

c) Experiment with P-Type MCT Doped Both with Silver and Indium

A 40 nm thick Ag layer was evaporated on the surface of n-MCT (3×4×1.1 mm) with specific resistance of 5.3 Ohm·cm, electron concentration of $3 \cdot 10^{15}$ cm$^{-3}$, electron mobility of 400 cm$^2$/(V·s). Samples were sealed in a quartz ampoule at $2 \times 10^{-5}$ Torr (Ar back pressure), heated up to 350° C. and kept for 7 days at this temperature. The characteristics of the resulting p-type material were: specific resistance $1.7–10^3$ Ohm·cm, hole concentration $7 \cdot 10^{14}$ cm$^{-3}$, hole mobility 8.6 cm$^2$/(V·s). The doped sample was polished and 40 nm thick, 50 µm diameter Au spots were evaporated on its surface.

Figures 1, 7A:
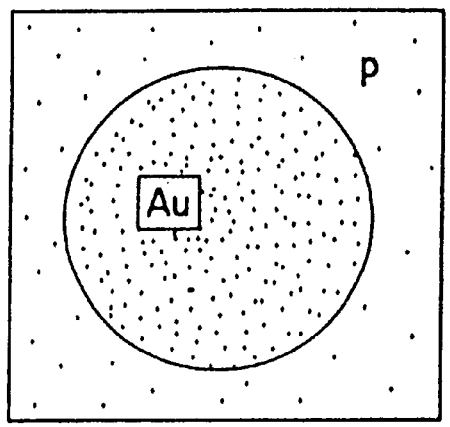
Figures 1, 7B:
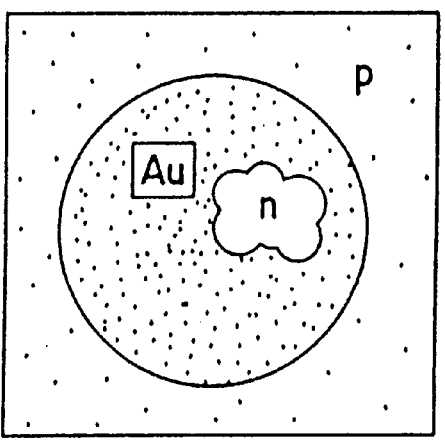
Figures 1, 7C:
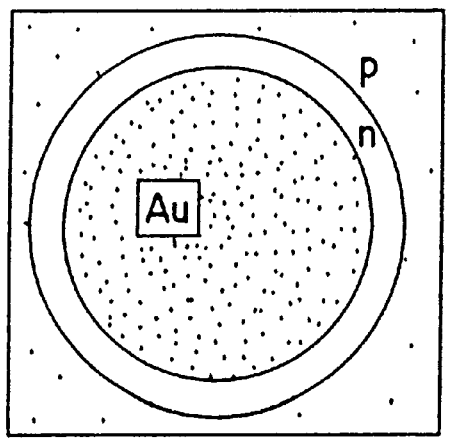
Figures 2, 7A:
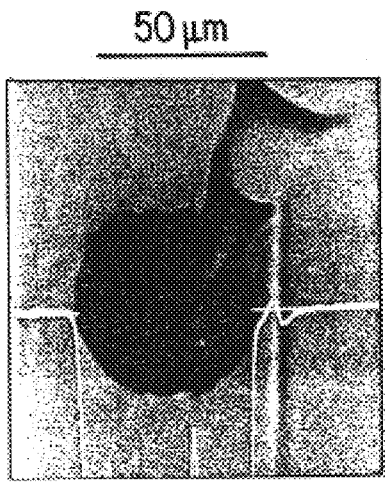
Figures 2, 7B:
Figures 2, 7C:
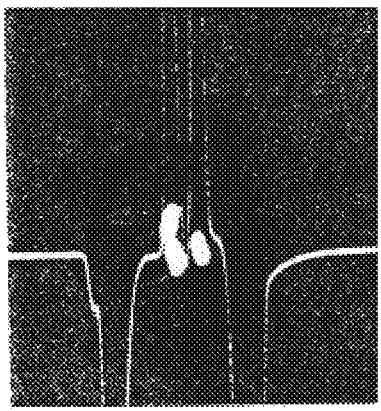
Figures 1, 8A:
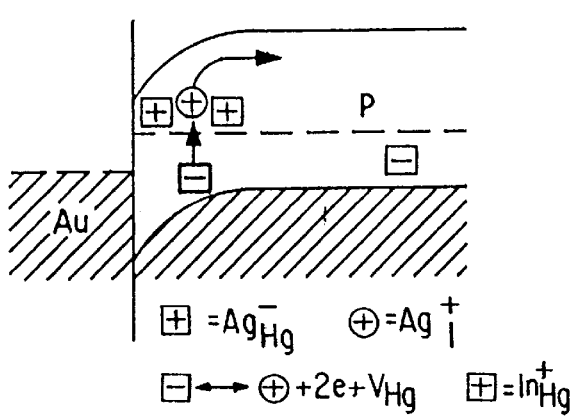
Figures 2, 8A:
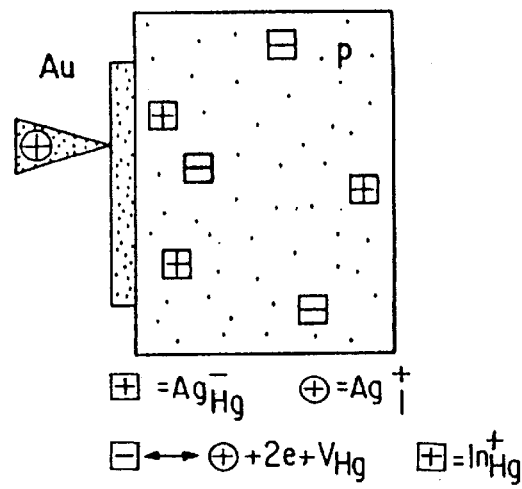
Figures 1, 8B:
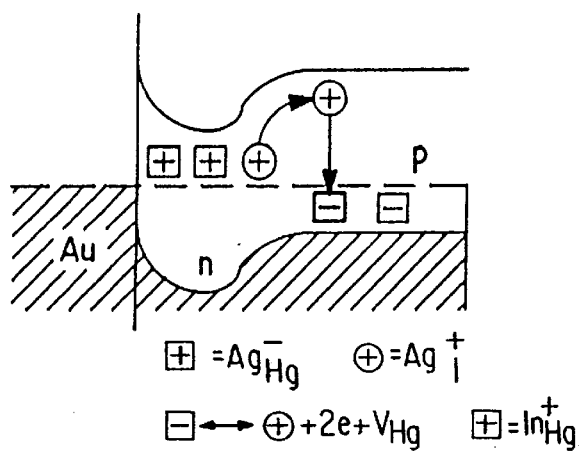
Figures 2, 8B:
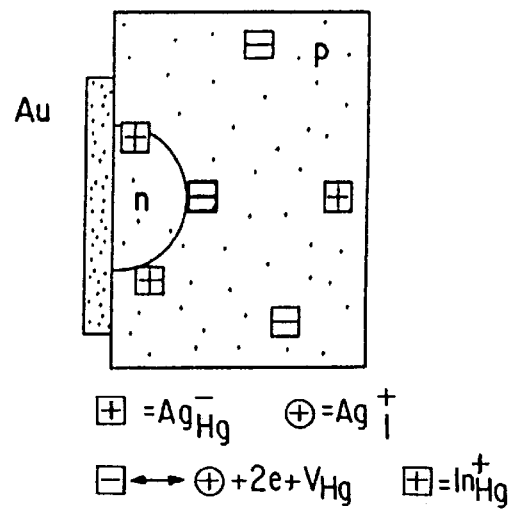
Figures 1, 8C:
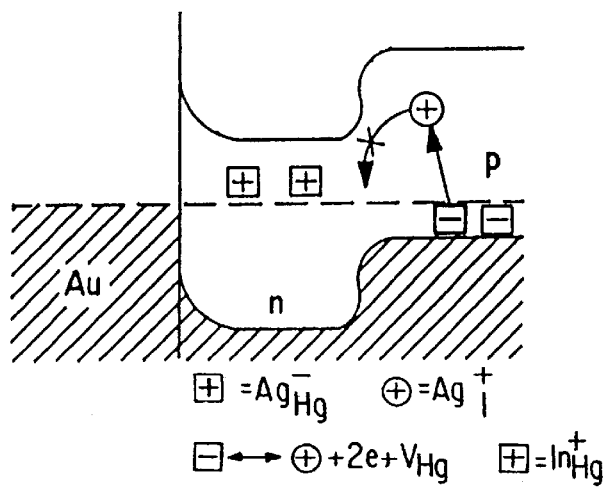
Figures 2, 8C:
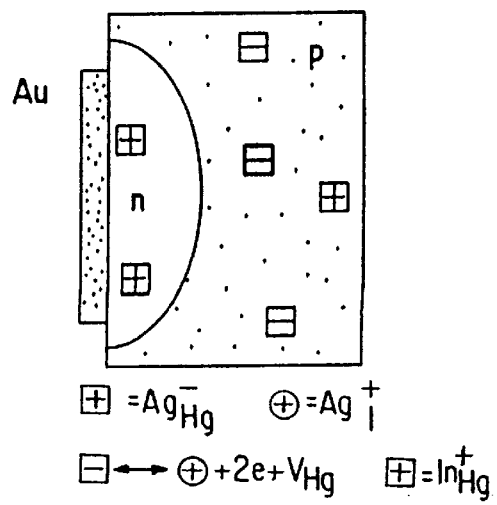

A bias of +25V (0.3 mA) was applied for 30 min. in the SEM. Initially EBIC indicated a Schottky barrier under the Au (FIG. 7a). After biasing a small area showed opposite, white, EBIC contrast (opposite direction of the electric field; cf. FIG. 7b). Without further bias this area expands. After one week EBIC indicated an n-p junction located 20 pm from the spot (FIG. 7c). It is believed that application of positive bias to the spot results in Ag+ electromigration from the spot and creation of a small n-type area (FIG. 8b). This n-type area expands, driven by the internal electric field, created by the p-n junction (increase in area with white contrast). The process stops when equilibrium between the fluxes due to the chemical-and electric potential in the concentration gradient and its self-created field is achieved (FIG. 8c).

d) Measurements of Chemical Diffusion Coefficient

The chemical diffusion coefficient of Ag in Ag-doped MCT was measured by a galvano-static, potential decay method, using a point, a reference and a back electrode [26]. This yields a value of $\sim 10^{-9}$ cm$^2$/s. An attempt to measure n-type MCT30 doped by In, without Ag, failed. No change of electrode potential was observed during 18 hours of observation. This suggests, that the value $10^{-9}$ cm$^2$/s refers to silver diffusion and that diffusion of any other species is characterized by coefficients $<10^{-12}$ cm$^2$/sec.

SUMMARY OF EXPERIMENTS a) In spite of the fact that Ag is an acceptor for MCT it moves under the influence of an electric field as a positively charged particle.

b) Ag can be introduced in MCT at room temperature, either by external positive bias, or by the electric field of a Schottky barrier. This process is reversible and Ag can precipitate back onto the surface by applying negative bias.

c) Ag moves in MCT under the influence of the self-created electric field. This movement is possible in the direction of its concentration gradient (against Fick's law).

d) A p-n junction can be formed in Ag-doped n-MCT and in p-MCT by applying an electric field. In spite of the fact that the diffusion coefficient of Ag is rather high, these junctions are stable during the time of observation (4 days).

Assumptions for the theoretical treatment were that:

a) Ag acts as an acceptor but diffuses as a donor.
b) The influence of AgI on the carrier concentration is negligibly small.
c) All species except Ag are distributed homogeneously and are not mobile.

The following general analysis was made. In the absence of a space charge eqn. 2.8 yields $$j = -D\left([TF]\frac{\partial c}{\partial x} - c\frac{1}{(D^+ - \beta c)}\beta\frac{\partial c}{\partial x}\right) \quad (4.1)$$

(c is silver concentration). If Ag is the only dopant, then $$j = -D([TF] - 1)\frac{\partial c}{\partial x} \quad (4.2)$$

Analysis of (4.2) shows a) If c is small, [TF] is >>1 and the internal field does not affect the diffusion.
b) At high concentrations (saturation area) [TF] is <1 and the diffusion is expected to be against Fick's law (in the direction of concentration gradient).
c) In between there should be the range of concentration, where the system is close to ideal, [TE] is close to 1 and the effective diffusion coefficient is close to zero.

Considering equilibrium in the presence of a space charge, the criterion for stability is $$E_{st} = [TF]\frac{kT}{ze}\frac{1}{c}\frac{\partial c}{\partial x} \quad (4.3)$$

For graded junction $$E_{max} = \frac{ed^2}{kT}\beta\frac{\partial c}{\partial x}. \quad [4]$$

If $$E_{st} > E_{\max}[TF] > \beta \left( c \left( \frac{ed}{kT} \right) \right)^2$$

the junction relaxes. The thickness, d, of the junction is a complicated function of $$\frac{\partial c}{\partial x}$$

and it can not be expressed explicitly. The calculation of the internal field in a graded junction was done numerically, in a manner similar to [27]. The function E(x) (x is length) is a solution of the system of the nonlinear differential equations:

$$\frac{\partial p}{\partial x} - \frac{e}{kT} pE = 0 \qquad (4.4)$$

$$\frac{\partial E}{\partial x} \frac{1}{4\pi\varepsilon\varepsilon_o} \left( p - \frac{K^1}{p} + n_{D^+-A^-}(x) \right)$$

p is the concentration of holes. The first equation describes the distribution of carriers in the presence of the electric field, E. The second equation is the Poisson equation for an arbitrary dopant profile $n_{D+-A-}$ (X). The boundary conditions are E(0)=0, E(L)=0. The numerical solutions were obtained for a doping profile as shown in FIG. 10.

Figure 9:
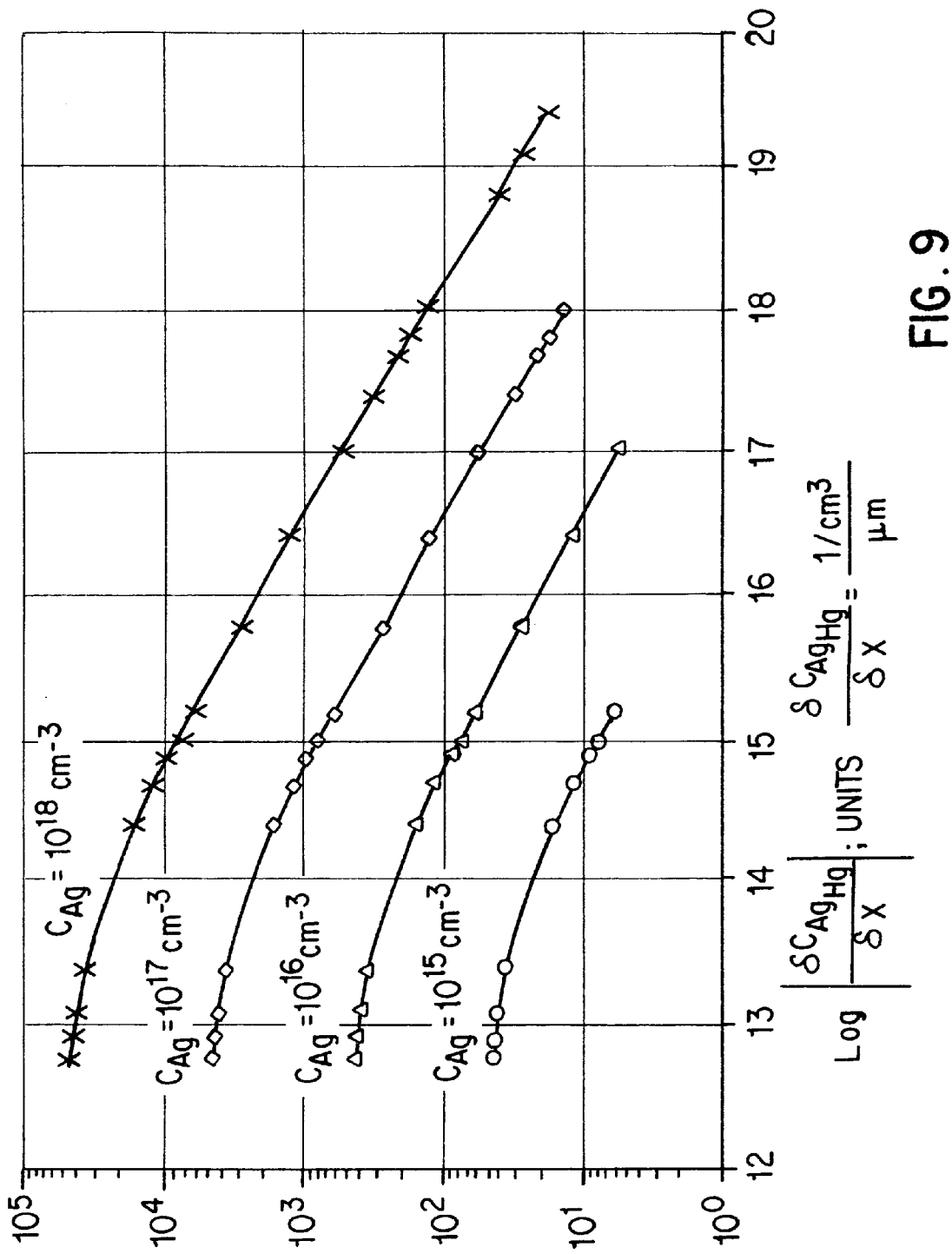
FIG. 9 shows a diagram of p-n junction self-stabilization. $C_{Ag}$ is the concentration of silver. $C_{Ag^-}Hg=\beta C_{Ag}$, $\beta$ is degree of ionization (of the order of 0.01 for the system silver/MCT30). $E_{max}$=is the maximal field in a graded p-n junction of a given gradient. $E_{st.ideal}$=is the built-in electric field, necessary for p-n junction self-stabilization in an ideal system (i.e. for [TF]=1). For a given system the built-in electric field, necessary for p-n junction self-stabilization is $E_{st.ideal}*[TF]$ ([TF] is a function of concentration). It means, that if the thermodynamic factor for a given system is larger than the calculated ratio $E_{max}/E_{st.ideal}$, then the junction is not stable because the maximal electric field in the junction is smaller than the electric field, necessary for its self-stabilization. If $E_{max}/E_{st.ideal}>>[TF]$, then electric field in the junction is much higher, than the electric field, necessary for p-n junction self-stabilization. Hence, electromigration in the direction of the concentration gradient (against Fick's law) is faster than diffusion in opposite direction. Therefore, the concentration gradient should increase by itself. If $E_{max}/E_{st.ideal}$ and [TF] are of the same order, then more complicated calculations are needed to predict junction evolution.

For each concentration gradient and concentration c of the diffusing species, the ration $E_{max}/E_{st.ideal}$ was calculated, where $E_{st.ideal}$ is obtained from the criterion for $E_{st}$ in an ideal system ([TF]=1). All calculated data are summarized in FIG. 9. Here $E_{max}/E_{st.ideal}$ is plotted versus the gradient of dopant concentration. If [TF]>$E_{max}/E_{st.ideal}$, the junction relaxes to the state with zero gradient. If $E_{max}/E_{st.ideal}$>> [TF], then the concentration gradient will increase by itself. From the plot we see that a system may have two stable states, one with zero gradient and one where the concentration gradient is not zero, and that not every p-n junction that is stable.

The following is a theoretical treatment showing calculation of equilibrium profile and modelling of junction evolution.

a) Calculation of the Equilibrium Profile
The equilibrium condition is given by eqn. 2.13

$$E_{st} = [TF] \frac{kT}{e} \frac{1}{c} \frac{\partial c}{\partial x}$$

In each point of the stable p-n junction relation (2.14) has to fulfilled. On the other hand electronic equilibrium is described by (4.4). Both conditions give together the system of the nonlinear differential equations $$\frac{\partial p}{\partial x} - \frac{e}{kT} pE = 0 \qquad (5.1a)$$

$$\frac{\partial E}{\partial x} = \frac{1}{4\pi\varepsilon\varepsilon_o} \left( p - \frac{K^i}{p} + n_D \cdot (x) - bc \right) \qquad (5.1b)$$

$$E = [TF] \frac{kT}{e} \frac{1}{c} \frac{\partial c}{\partial x} \qquad (5.1c)$$

where all the notations are kept from eqns. (2.14) and (4.4). Substituting (5.1c) into (5.1a) yields:

$$c = Ap^{\frac{1}{[TF]}} \qquad (5.2)$$

Therefore the set of equations (5.1) can be rewritten as $$\frac{\partial p}{\partial x} - \frac{e}{kT} pE = 0 \qquad (5.3)$$

$$\frac{\partial E}{\partial x} = \frac{1}{4\pi\varepsilon\varepsilon_o} \left( p - \frac{K^i}{p} + n_D \cdot (x) - bAp^{\frac{1}{[TF]}} \right)$$

where A is an unknown constant. The boundary conditions are the same as for (4.4): E(0)=0, E(L)=0. A solution of equation (5.3) gives the static distribution of the electric field and carrier density (and dopant concentration as well) for the self-stabilizing p-n junction.

b) Modeling of Junction Evolution
By adding to eqn. (4.4) the continuity equation for ions we can get a system of equations, which describes the movement of ions under the influence of the self-created field in the p-n junction.

$$\frac{\partial p}{\partial x} - \frac{e}{kT} pE = 0 \qquad (5.4a)$$

$$\frac{\partial E}{\partial x} = \frac{1}{4\pi\varepsilon\varepsilon_o} \left( p - \frac{K^1}{p} + n_D \cdot (x) - \beta c \right) \qquad (5.4b)$$

$$\frac{\partial c}{\partial t} = D \frac{\partial^2 c}{\partial x^2} + [TF] \frac{De}{kT} cE \quad \text{(continuity equation)} \qquad (5.4c)$$

The boundary conditions are again E(0)=0, E(L)=0. One more condition is the conservation of number particles, $$\int_0^L c \, dx = C_o,$$

where $c_0$ is the total amount of particles in the sample.

In addition to the foregoing, further specific examples have been carried out to demonstrate that a semiconductor device can be developed or made following the teachings of the invention wherein the semiconductor device has a p-n junction based on dopant profile in equilibrium with internal electric field created by this junction prepared in the materials of the following chemical composition $Hg_xCd_{1-x}Te$, with x=0.2–0.5 and $Zn_xHg_{1-x}Te$ with x=0.4–0.6. Also, the semiconductor device developed or made according to the teachings of the invention will be a semiconductor device with a p-n junction based on a dopant profile in equilibrium with the internal electric field created by this junction, which is able to restore its electrical properties by itself after electrical or thermal perturbation.

EXAMPLE 1

(Hg,Cd)Te and (Zn,Hg)Te samples were polished chemomechanically, using 5% (v/v) solution of $Br_2$/ethylene glycol solution. Subsequently, with in a time less than 5 min., 40 nm thick and 50 µm diameter Ag spots were evaporated on their front surface. A large area C-paste back contact was applied to the opposite side of the sample.

a) Electromigration into P-Type Materials
Qualitatively the behavior and the EBIC images that are obtained with these samples after voltage application are as described in example a) of the above description, a) Fast reversible electric field injection of silver in p-type material. Quantitative data, which express the differences, are given in Table 1.

Application of positive bias $V_{inject}^n$ (see Table 1) in the form of trapezoidal pulses (f=45 Hz, duty cycle 5%) for a time $T_{disap}^p$ to the silver spot results in disappearances of Ag, according to EDS.

TABLE 1

Data on silver electromigration into D-type material.

| Sample | Specific Resistance Ohm*cm | Hole Concentration 1/cm³ | Hole mobility cm²/(V*s) | $V_{inject}^n$, V | $T_{disap}^p$ |
|---|---|---|---|---|---|
| $Hg_{0.2}Cd_{0.8}Te$ | 2.7 | 5*10¹⁵ | 45 | 0 | 8 days |
| | | | | 10 | 14 hours |
| | | | | 25 | 9 hours |
| | | | | 40 | 0.5–2 hours |
| $Hg_{0.4}Cd_{0.6}Te$ | 11 | 2.1*10¹⁵ | 35 | 0 | 20 hours |
| | | | | 10 | 4 hours |
| | | | | 25 | 45 min. |
| | | | | 40 | 2–5 min. |
| $Hg_{0.45}Cd_{0.55}Te$ | 5.4 | 10¹⁶ | 43 | 0 | 18 hours |
| | | | | 10 | 2–3 hours |
| | | | | 25 | 30 min. |
| | | | | 40 | 1–2 min. |
| $Zn_{0.8}Hg_{0.2}Te$ | 8.6 | 3*10¹⁶ | 24 | 0 | 28 hours |
| | | | | 10 | 14 hours |
| | | | | 25 | 25 min. |
| | | | | 40 | 1–2 min. |

Simultaneously a change of EBIC signal is observed, similar to what has been described in example a) of the above description, a) Fast reversible electric field injection of silver in p-type material. Application of negative bias after positive bias results in precipitation of silver on the front surface in the form of dendrites (see FIG. 1c-2).

EXAMPLE 2

(Hg,Cd)Te and (Zn,Hg)Te samples were polished chemomechanically, using 5% (v/v) solution of $Br_2$/ethylene glycol solution. Subsequently, within a time less than 5 min, 40 nm thick and 50 μm diameter Ag spots were evaporated on their front surface. A large area C-paste back contact was applied to the opposite side of the sample.

The scheme of experiment was as described in example b) of the above description, b) Electromigration of silver into n-type MCT. Quantitatively all samples show the same behavior, which is identical to that described in example b.

Application of positive bias $V_{inject}^n$ for time $T_{disapp}^n$ to the silver spots results in formation of inhomeogeneously doped p-type area in the vicinity of the spot. This can be detected by measuring the Seebeck coefficient and by EBIC. Then the system evolves by itself into an n-p-n structure during a time $T_{evolv}^n$. The n-p-n structures that are formed in this way are stable in time.

TABLE 2

Data of silver electromigration into n-type material.

| Sample | Specific Resistance Ohm*cm | Electron concentration 1/cm³ | Electron mobility cm²/(V*s) | $V_{inject}$, V | $T_{disapp}$ | $T_{evolv}$ |
|---|---|---|---|---|---|---|
| $Hg_{0.2}Cd_{0.8}Te$ | 1.5 | 1.2*10¹⁶ | 340 | 7–14 | 2 days | 1.5 days |
| $Hg_{0.4}Cd_{0.6}Te$ | 2.9 | 4.8*10¹⁵ | 450 | 5–8 | 20 hours | 15 hours |
| $Hg_{0.45}Cd_{0.55}Te$ | 1.2 | 1.0*10¹⁶ | 480 | 3–5 | 14 hours | 15 hours |
| $Zn_{0.8}Hg_{0.2}Te$ | 3.1 | 5.2*10¹⁵ | 390 | 3–5 | 24 hours | 20 hours |

Figure 10A:
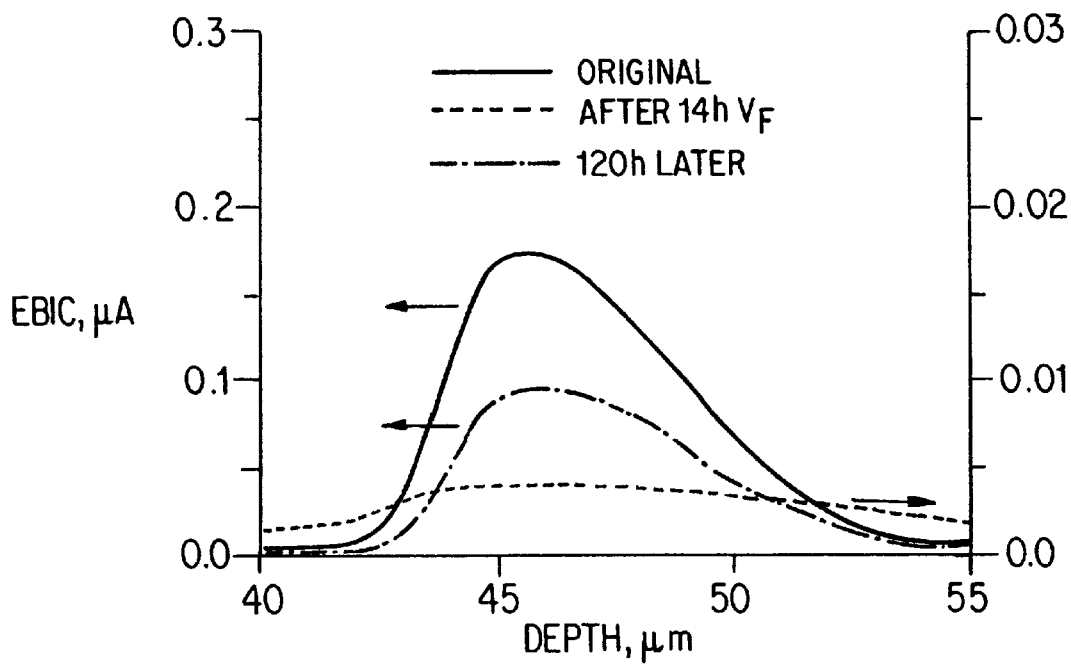
FIG. 10a shows EBIC line scans of the p-n junction formed in a crystal of n-$Hg_{0.3}Cd_{0.7}Te$ according to Example 3.
Figure 10B:
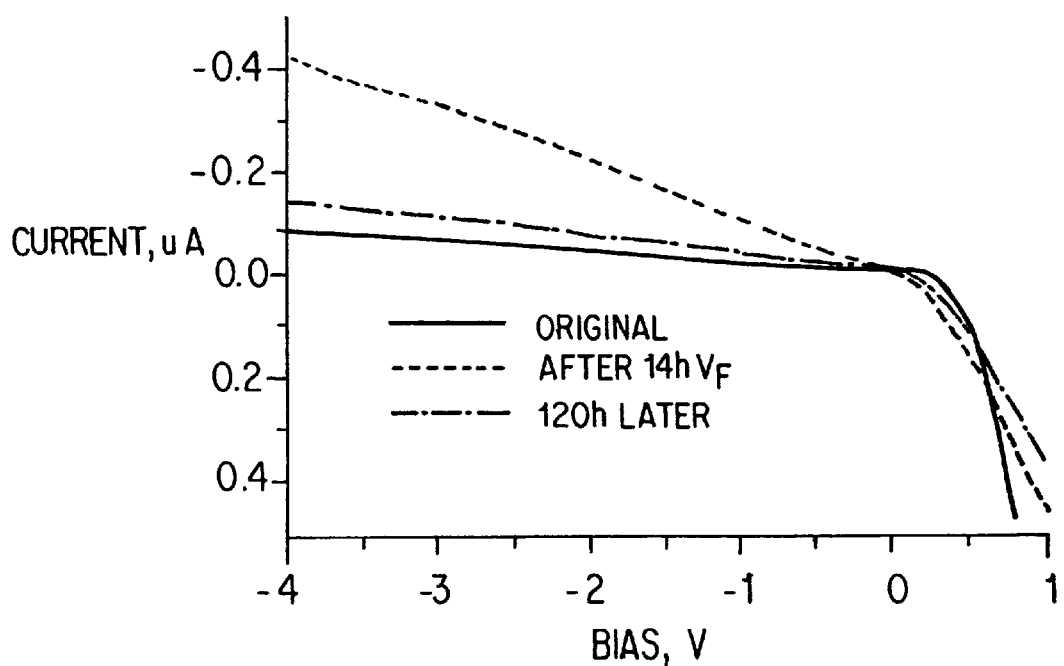
FIG. 10b shows the I–V curves of the p-n junction of Example 3.

EXAMPLE 3 n-$Hg_{0.3}Cd_{0.7}Te$ with n=3*10¹⁵, μ=400 cm²/(V*sec) was etched by Bromine Ethylene glycol solution (5 % v/v). A silver layer 1–4 μm was evaporated on their surface. The sample was baked in vacuum ($\leq$2*10⁻⁵ mTorr) at 160° C. for 24 h. After baking the edges of the samples were removed. The sample was cut to expose a surface perpendicular to the p-n junction, which was then polished. Electrical contact to the n and p parts of the samples was made by sputtering Au (contact resistance; 2*10²+2*10³ Ω/mm). Originally the I–V characteristics are those of a diode. Current under reverse bias 4 V is about 0.1 μA. EBIC line scans of cross section and I–V curves of a crystal of n-$Hg_{0.3}Cd_7te$, with n=3·10¹⁵ cm⁻³ and μ=400 cm²/V·sec are shown in FIGS. 10a and 10b. The p-n junction is formed some 45 μm inside the crystal by heating the sample with Ag for 24 hr at 160° C. Then p-n junction was perturbed by application of forward bias (14 hr of 4 V forward bias across the 0.8 mm thick crystal, passing 350 (initial)–250 μA through the sample (area=0.02 cm², i.e. 5 mA/cm²)). 5 days after application of forward bias was stopped, the pin junction is essentially restored.

FIG. 10a shows EBIC line scans of the p-n junction taken across the same path. The zero for the depth scale is at the crystal surface, and FIG. 10b shows I–V curves of the p-n junction.

Sufficient forward biasing of a p/n junction, prepared as described above, leads to degradation of the p/n junction, as shown by EBIC (FIG. 10a) and I–V measurements (FIG. 10b, current under reverse bias increase severalfold). However, its properties were restored after being kept for a few days at room temperature (FIGS. 10a, 10b). As is shown in FIG. 10b, the current under reverse bias recovered nearly to the original value. This means that the device is able to recover its rectifying properties by itself.

Figure 11A:
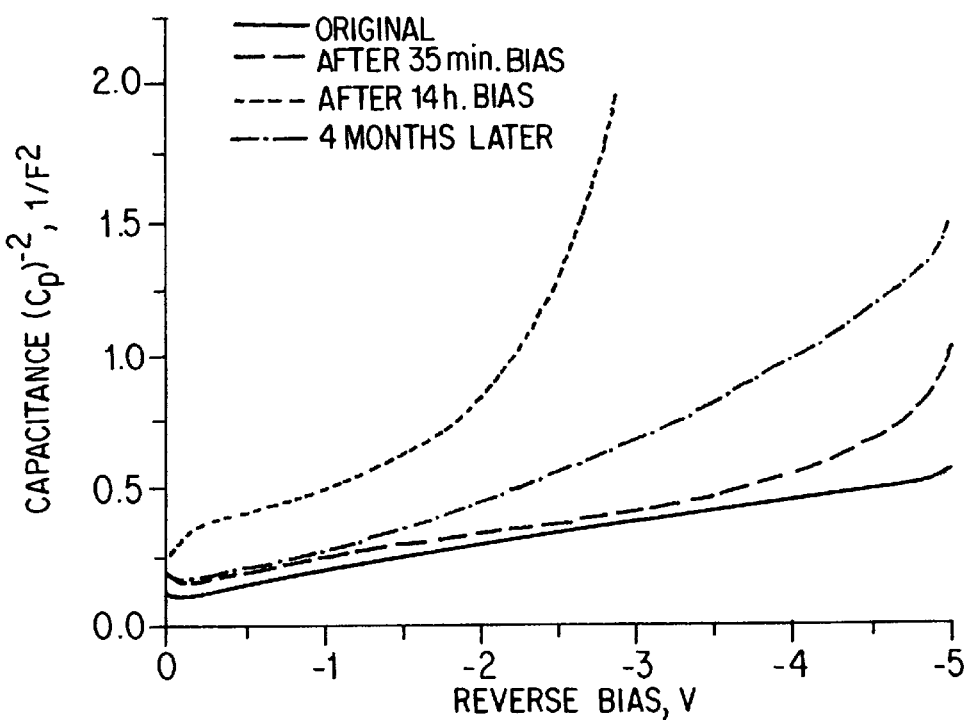
FIG. 11a and FIG. 11B show electrical characterization of a p-n junction in a crystal of n-$(Hg_{0.3}Cd_{0.7})Te$ with FIG. 11a showing dependence of parallel capacitance, Cp, as 1l(Cp)2, on applied reverse bias voltage V, and FIG. 11b showing dependence of parallel resistance, Rp, on applied reverse bias voltage V.
Figure 11B:
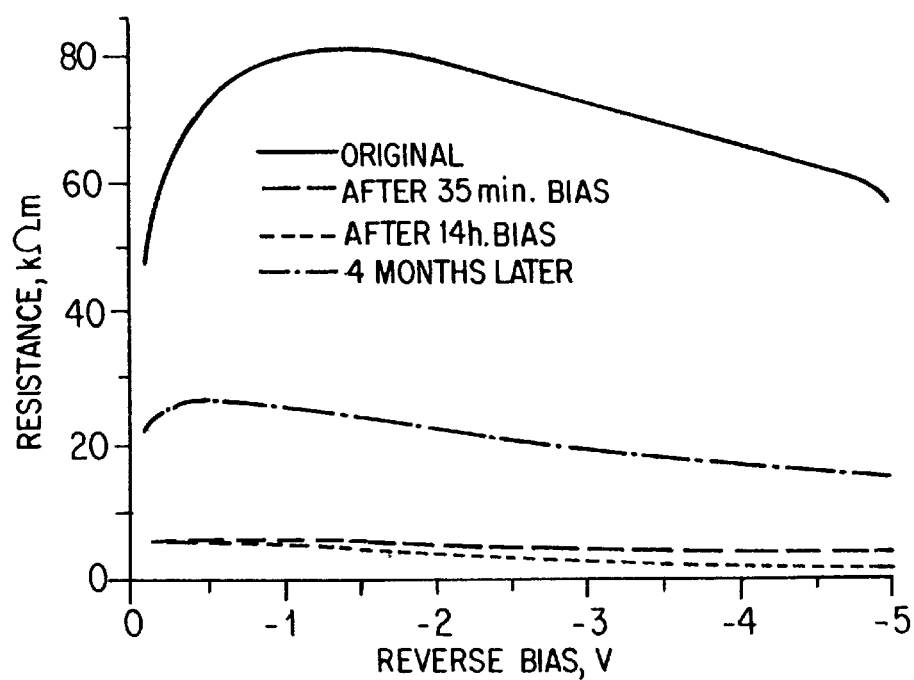

Electrical characterization of a p-n junction in a crystal of n-$(Hg_{0.3}Cd_{0.7})Te$, with n=$2.5*10^{15}$ cm$^{-3}$ and $\mu$=400 cm$^2$/V·sec, before, during and after forward bias application of 5 V is shown in FIGS. 11a and 11b. The junction, which was 15 $\mu$m deep, was prepared by the thermal in-diffusion of Ag during 14 days at 120° C. During the 14 hr. of biasing the current decreased from 15 to 12 mA.

FIG. 11a shows dependence of parallel capacitance, Cp, as 1/(Cp)2, on applied reverse bias voltage, V.

FIG. 11b shows dependence of parallel resistance, Rp, on applied reverse bias voltage, V.

By performing C–V measurements at intervals during biasing it was possible to check the evolution of doping in the space charge region (FIG. 11a). The drop in capacitance, Cp, with time is slower than that of the parallel resistance, Rp, which reflects the leakage current across the junction (FIG. 11b). FIG. 11b also indicates that the rectifying properties restore by themselves. As shown in FIG. 11a, the slope of C–V characteristics return close to the original ones. This demonstrates that the thickness of space charge region after restoration process is close to the original one. Hence, the doping profile and all device properties are restored.

If forward bias was applied for much longer times (>48 hours), the junction was eliminated and did not recover.

EXAMPLE 4 n-$Hg_{0.3}Cd_{0.7}$ Te with n=$3*10^{15}$, $\mu$=400 cm$^2$/(V*sec) was etched by Bromine Ethylene glycol solution (5% v/v). A silver layer 1–4 $\mu$m was evaporated on the surface. The sample was baked in vacuum ($\leq 2*10^{-5}$ mTorr) at 350° C. for 8 h. After baking, the edges of the samples were removed. The sample was cut to expose a surface perpendicular to the p-n junction, which was then polished. Electrical contact to the n and p parts of the samples was made by sputtering Au (contact resistance: $2*10^2$–$2*10^3$ $\Omega$/mm$^2$).

Moderate heating to 180° C. for 8 min. was applied to the sample containing a junction, located at 350 $\mu$m depth (formed according to the description given in the previous paragraph). Then the junction was kept at room temperature.

Figure 12A:
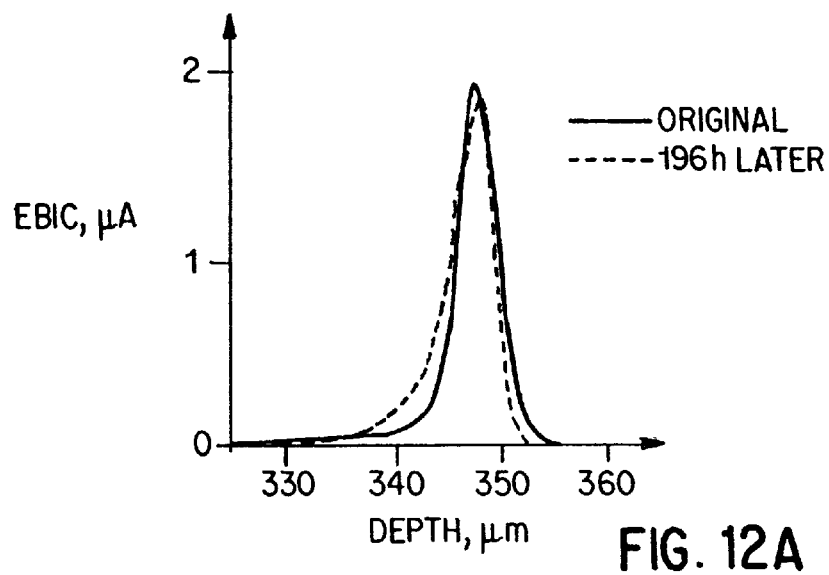
FIG. 12a, FIG. 12b and FIG. 12c show EBIC line scans of cross section of a crystal n-$(Hg_{0.3}Cd_{0.7})Te$ with FIG. 12a showing the original situation and one obtained 196 hours after thermal perturbation, FIG. 12b showing the same region immediately after heating at 180° C. for 8 minutes, and FIG. 12c showing the same region 12 hours later.

FIGS. 12a, b, c show EBIC line scans of cross section of a crystal of n-$(Hg_{0.3}Cd_{0.7})$ Te, with n=$3\cdot10^{15}$ cm$^{-3}$ and $\mu$=400 cm$^2$/V·sec, containing a pin junction, obtained after thermal in-diffusion of Ag during 8 hr at 350° C. FIG. 12a shows the original situation and the one obtained 196 h after thermal perturbation (cf. Image b).

Figure 12B:
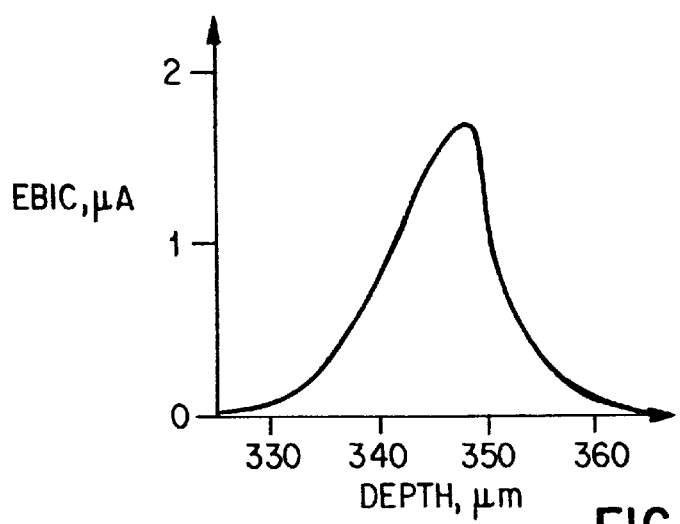

FIG. 12b shows the same region after heating at 180° C. for 8 min.

Figure 12C:
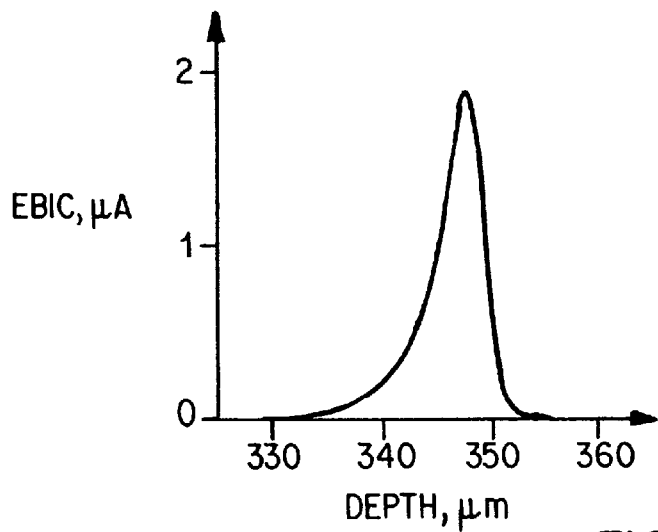

FIG. 12c shows the same region 12 hr later. During this time the sample was kept at room temperature.

EBIC images and line scans, taken on the same place, before and after heating were broadened, consistent with degradation of the junction. Already 12 hrs after the short heating process, significant sharpening of the EBIC signal is observed, and after 8 days the original EBIC signal is essentially restored. The evolution of I–V and C–V characteristics is similar to evolution of I–V and C–V characteristics described in Example 3.

EXAMPLE 5

Figure 13A:
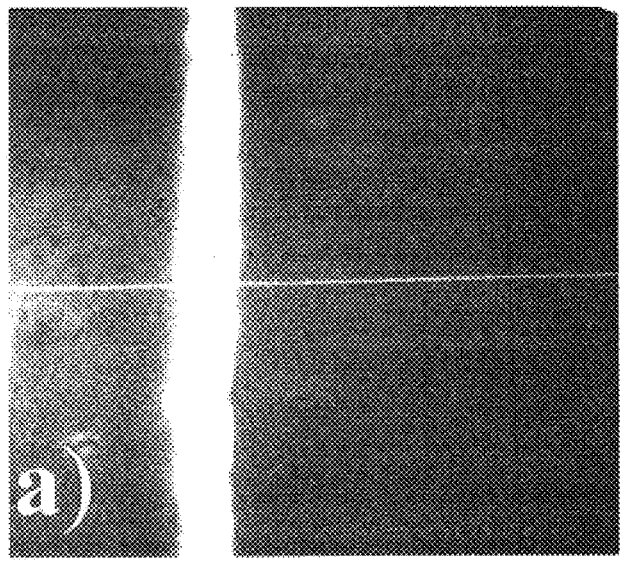
FIGS. 13a–c show self-restoration of the p-n junction created by Ag diffusion in n-$Hg_{0.3}Cd_{0.7}Te$ after electrical perturbation.
Figure 13B:
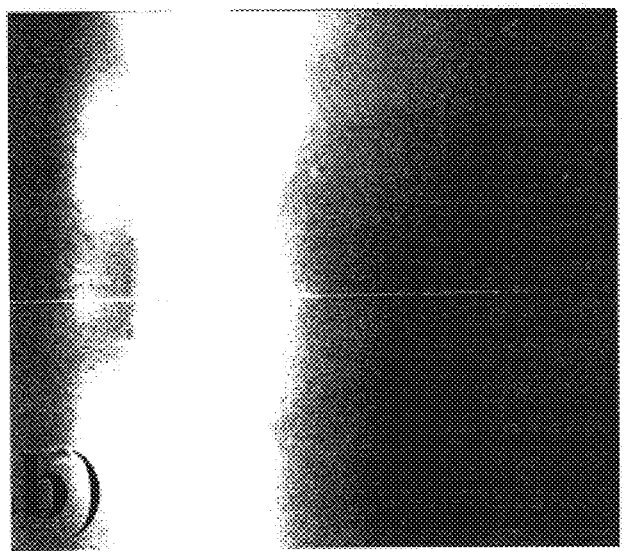
Figure 13C:
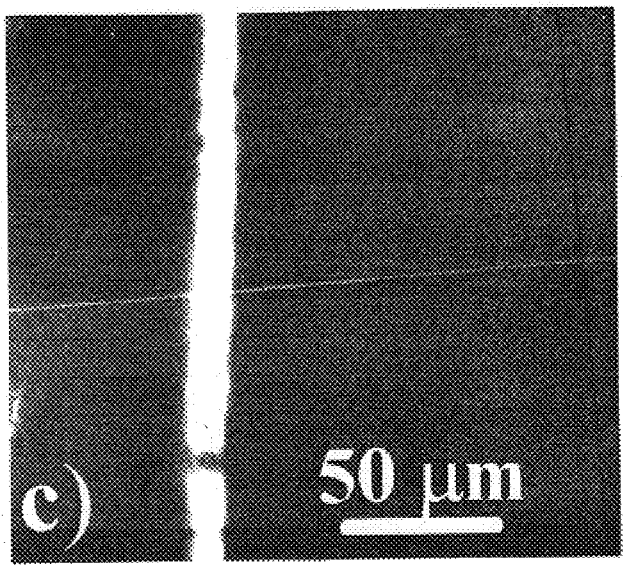

Self-restoration of rectifying properties of a p-n junction prepared by silver diffusion into n-$Hg_{0.3}Cd_{0.7}Te$ is described. FIGS. 13a–c show combined secondary electron (SE)/EBIC images of a cross-section of the n-$Hg_{0.3}Cd_{0.7}Te$ crystal. The surface, onto which Ag was evaporated, coincides with the left border of the images.

FIG. 13a shows that after heating the sample with Ag for 24 h @ 160° C. a p-n junction is formed some 45 $\mu$m inside crystal (shown by white band inside crystal).

FIG. 13b shows SE/EBIC image of same region after 14 h of 4 V forward bias application @ 15 mA/cm$^2$ across 8 mm thick crystal. Applied voltage includes potential drops across non-ideal contacts. During bias no heating above room temperature was observed. Because of decrease in EBIC signal, 200x larger amplification was used for this image.

FIG. 13c shows SE/EBIC picture of same region, 5 days after application of forward bias was stopped, showing restoration of p-n junction. During this time the sample was kept at room temperature and not subjected to any electrical influence. The EBIC amplification is now the same as used for (a).

Figure 13D:
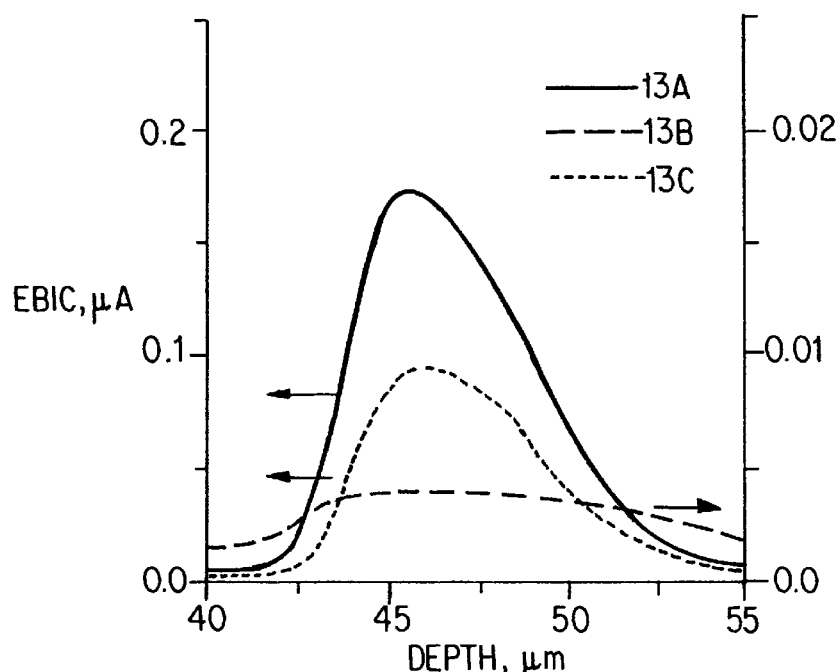
FIGS. 13d–e show EBIC line scans and I–V curves, respectively, of the p-n junction shown in FIGS. 13a–c.
Figure 13E:
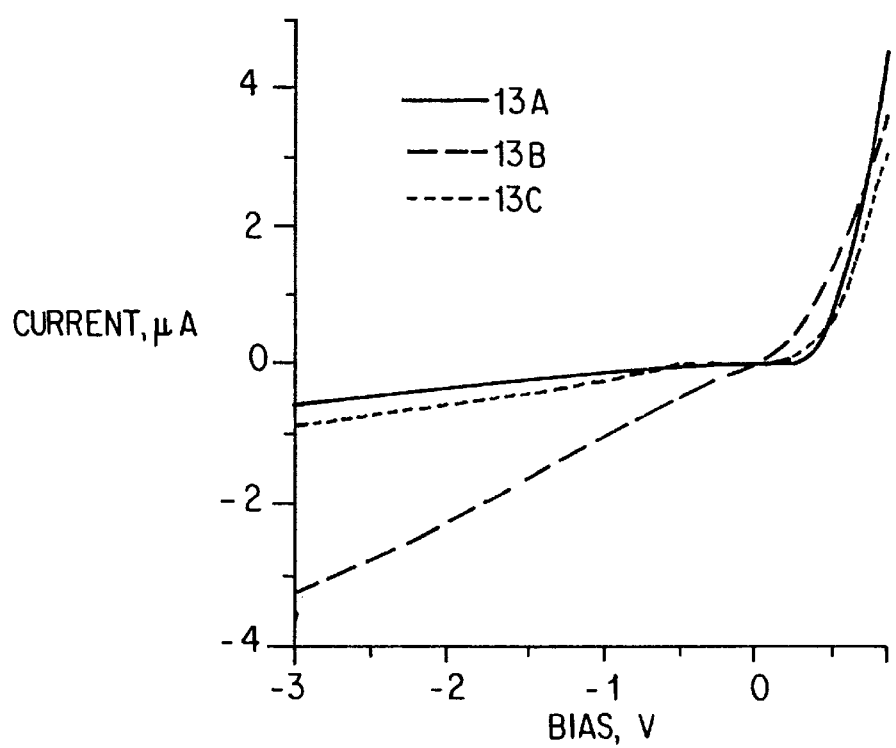

Right-hand side of FIGS. 13a–c shows EBIC line scans (FIG. 13d, top) and I–V curves (FIG. 13e, bottom) of the junction shown on FIGS. 13a–c.

Similar results were obtained for all materials with composition $Hg_xCd_{1-x}Te$ (x=0.2–0.4).

EXAMPLE 6

Figure 14A:
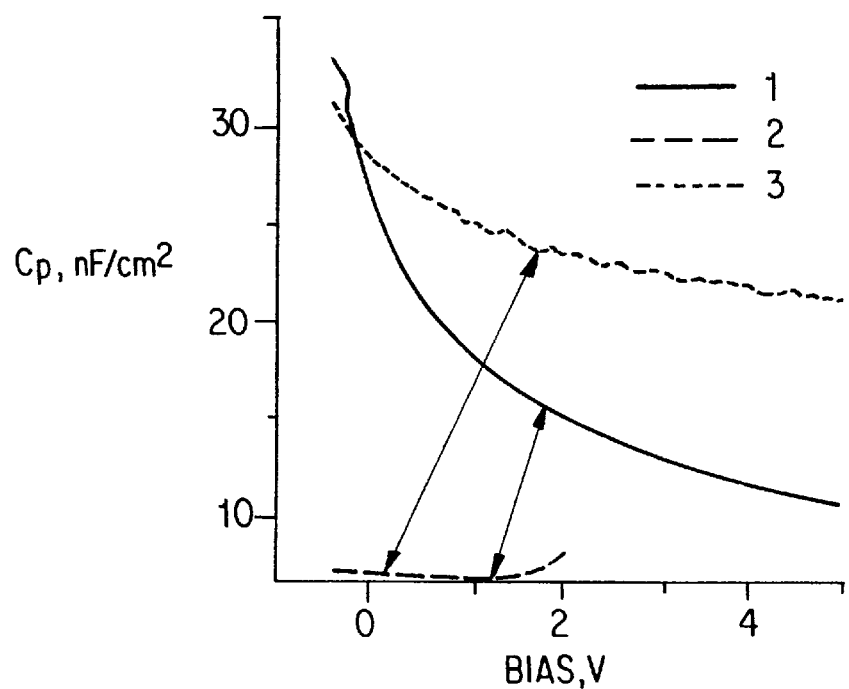
FIGS. 14a–d show electrical properties of the p-n junction created by Zn diffusion into InP before perturbation, just after perturbation, and after self-restoration of the rectifying properties.
Figure 14B:
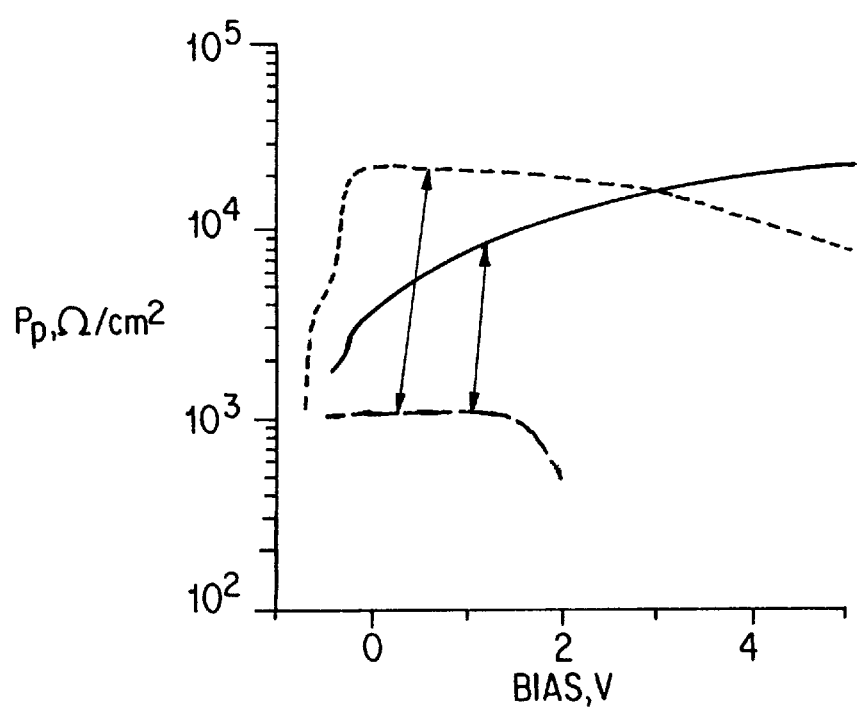
Figure 14C:
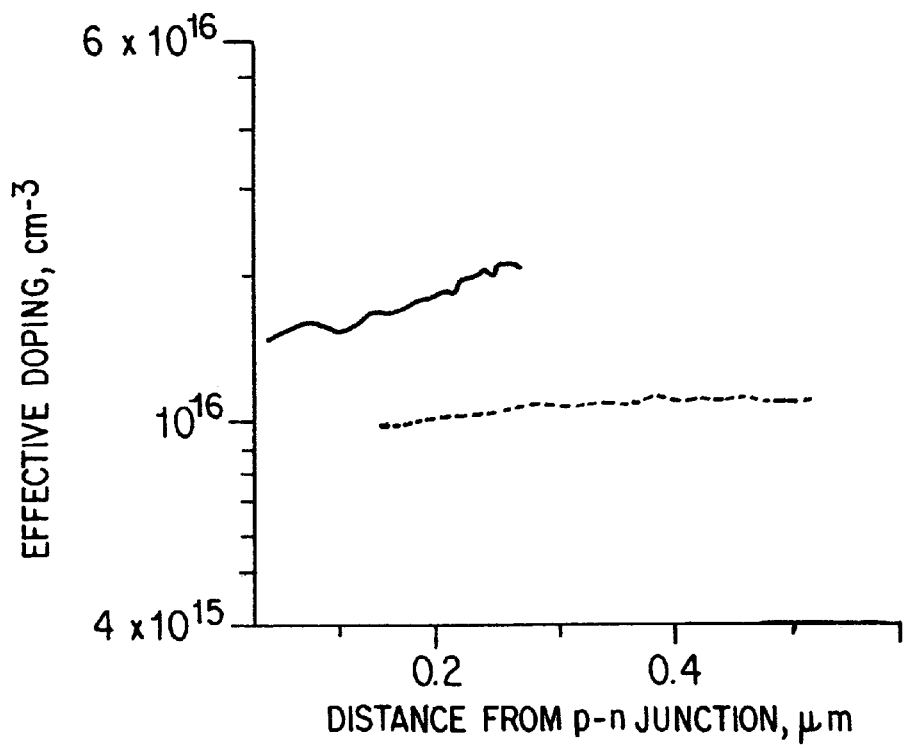
Figure 14:
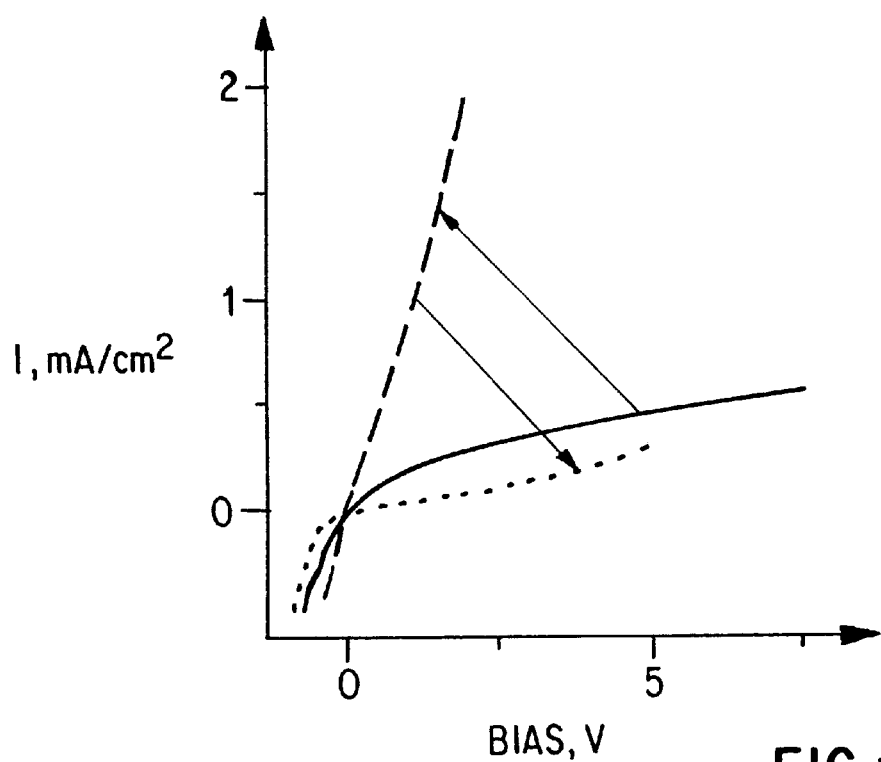

Similar to Example 5, self-restoration of rectifying properties of a p-n junction can be obtained in the system InP:Zn. FIG. 14 shows electrical properties of the p-n-junction prepared by Zn diffusion into InP before perturbation, just after perturbation, and after self-restoration of the rectifying properties. FIG. 14a shows equivalent parallel capacitance versus voltage, FIG. 14b shows equivalent parallel resistance versus voltage, both measured at 10 kHz. FIG. 14c shows the doping depth profile deduced from the data shown in FIG. 14a. FIG. 14d shows current-voltage characteristics.

The p-n junction was prepared by heating of n-InP (n=$2\times10^{17}$ cm$^{-3}$) in Zn vapor in a closed ampoule in dynamic vacuum of 10$^{-5}$ mTorr for 40 min. @ 580° C. As prepared it showed good rectifying properties (curve 1).

Thermal perturbation of the p-n junction by heating for 30 min. at 650° C. resulted in degradation of rectifying properties of the junction. The perturbed p-n junction had 2 orders of magnitude less capacitance than before perturbation; its I–V curve did not show any rectifying properties anymore (curve 2).

The self-restoration of the rectifying properties occurred during annealing for 48 hrs. at 420° C. Note that the restoration process converts the junction into an almost ideally abrupt one, i.e., doping in the vicinity of the p-n junction is constant and the I–V curve becomes similar to the original one (curve 3). Similar results were obtained with Be as dopant.

EXAMPLE 7

Figure 15:
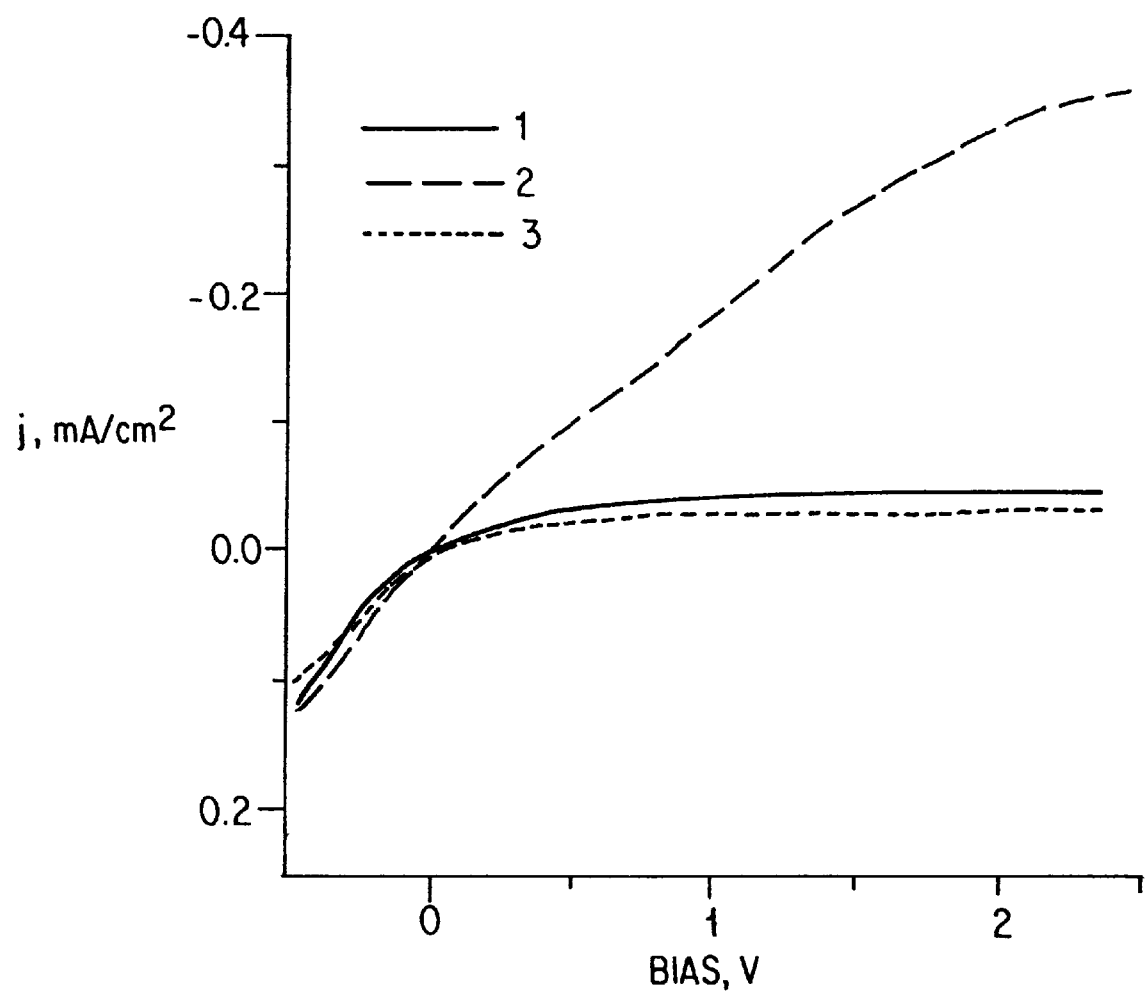
FIG. 15 shows the I–V curve of the p-n junction prepared by Be diffusion into GaAs.

Self-restoration of rectifying properties of a p-n junction was also observed in the system GaAs:Be. FIG. 15 shows the I–V curve of the p-n junction prepared by Be diffusion into GaAs (n=8×10$^{18}$ cm$^{-3}$) for 1 hour @ 650° C. before perturbation (curve 1), just after perturbation by heating for 130 min. @ 750° C. (curve 2) and after self-restoration occurred by annealing for 3 days @ 450° C. (curve 3). Similar results are obtained with Cd or Zn, according to conditions shown in Table 1.

The data for other materials and dopants are given in Table 1.

TABLE 1

| semiconductor | dopant | Preparation temperature | time | Thermal Perturbation temperature | time | Restoration temperature | time | Fig. |
|---|---|---|---|---|---|---|---|---|
| Hg$_x$Cd$_{1-x}$Te (x = 0.2–0.4) | Ag | 105–160° C. | 1–15 days | 180–200° C. | 10–30 min. | 20–80° C. | 0.5–100 days | 1 |
| InP | Zn | 540–600° C. | 10–60 min. | 650–680° C. | 10–30 min. | 400–440° C. | 2–5 days | 2 |
|  | Be |  |  |  |  |  |  |  |
| GaAs | Zn | 600–700° C. | 30–60 min. | 700–750° C. | 20–40 min. | 450–550° C. | 3–5 days | 3 |
|  | Cd | 600–700° C. |  | 780–800° C. |  |  |  |  |
|  | Be | 600–700° C. |  | 700–750° C. |  |  |  |  |
| A$_x$B$_{1-x}$C, where A,B = Al,Ga,In C = Sb,As, x = 0 ÷ 1 | Zn Cd Be | depends on composition |  |  |  |  |  |  |

SUMMARY

Phenomena of self-creation, electric field-stabilization of a dopant concentration profile can be expected in any system, where electrically active impurities diffuse by the dissociative mechanism. This is expected to be a general way for creation of stable concentration gradients in any material where diffusion is accompanied by the creation of an internal electric field.

What is claimed is:

1. A semiconductor device comprising:
   a body made of zinc mercury telluride of the formula Zn$_x$Hg$_{1-z}$Te, said body being one of n-type and p-type; and
   a dopant contained in said body which defines therein a stable p-n junction having a stable concentration gradient which is in equilibrium with an internal electric field inherently created by the p-n junction;
   wherein x=0.4 to 0.6 for Zn$_x$Hg$_{1-x}$Te.

2. A semiconductor device according to claim 1, wherein said body defines two stable p-n junctions.

3. A semiconductor device according to claim 1 wherein said body is doped with indium to create an n-type conductivity.

4. A semiconductor device comprising:
   a body made of zinc mercury telluride of the formula Zn$_x$Hg$_{1-x}$Te, said body being one of n-type and p-type; and
   a dopant contained in said body which defines therein a stable p-n junction having a stable concentration gradient which is in equilibrium with an internal electric field inherently created by the p-n junction;
   wherein the body is of p-type conductivity intially established by the body containing silver and indium.

5. A semiconductor device comprising a body of mercury cadmium telluride of the formula Hg$_x$Cd$_{1-x}$Te being of n-type containing a silver dopant which defines in the body a stable p-n junction having a stable concentration gradient in equilibrium with an internal electric field inherently created by the junction, wherein x is in one of a first range such that $0.2 \leq x < 0.3$ and a second range such that $0.3 < x \leq 0.5$.

6. A semiconductor device according to claim 5 wherein said body is composed of Hg$_{0.2}$Cd$_{0.8}$Te.

7. A semiconductor device according to claim 5 wherein said body is composed of Hg$_{0.4}$Cd$_{0.6}$Te.

8. A semiconductor device according to claim 5 wherein said body is composed of Hg$_{0.45}$Cd$_{0.55}$Te.

9. A semiconductor device comprising:
   a body made of zinc mercury telluride of the formula Zn$_x$Hg$_{1-x}$Te, said body being one of n-type and p-type; and
   a dopant contained in said body which defines therein a stable p-n junction having a stable concentration gradient which is in equilibrium with an internal electric field inherently created by the p-n junction;
   wherein said body is composed of Zn$_{0.5}$Hg$_{0.5}$Te.

10. A semiconductor device comprising a body of mercury cadmium telluride of the formula Hg$_x$Cd$_{1-x}$Te being of p-type containing a silver dopant which defines in the body a stable p-n junction having a stable concentration gradient in equilibrium with an internal electric field inherently created by the junction, wherein x is in one of a first range such that $0.2 \leq x < 0.3$ and a second range such that $0.3 < x < 0.5$.

11. A semiconductor device according to claim 10 wherein said body is composed of Hg$_{0.2}$Cd$_{0.8}$Te.

12. A semiconductor device according to claim 10 wherein said body is composed of Hg$_{0.4}$Cd$_{0.6}$Te.

13. A semiconductor device according to claim 10 wherein said body is composed of Hg$_{0.45}$Cd$_{0.55}$Te.

14. A semiconductor device according to claim 5 wherein said body is doped with indium to create an n-type conductivity.

15. A semiconductor device comprising a body of a semiconductor material being of one of n- or p-type selected from the group consisting of GaAs, InP, Hg$_x$Cd$_{1-x}$Te, wherein x is 0.19–0.29, 0.31–0.41, Zn$_x$Hg$_{1-x}$Te wherein x is 0.4–0.6, and A$_x$B$_{1-x}$C wherein A and B are different elements selected from the group consisting of Al, Ga and In, C is As or Sb and x is from 0 to 1, containing an electrically active dopant selected from the group consisting of Ag, Be, Cd and Zn, said dopant defining in said body of said semiconductor material a stable p-n junction having a stable concentration gradient in equilibrium with an internal electric field inherently created by the p-n junction, as a result of which the electrical properties of the said device are self-restored after being degraded by an external perturbation.

16. A semiconductor device according to claim 15, wherein said external perturbation is selected from application of forward electrical bias, heating at a temperature above that used for preparing the doped body, illumination with photons of energy higher than the bandgap or by exposure to a beam of energetic particles, and wherein self-restoration of said electric properties of the device occurs at a temperature below the temperature needed for the thermal perturbation, where the intrinsic electronic carrier concentration is at least two orders of magnitude below that of the electrically active dopants.

17. A semiconductor device according to claim 16, wherein said semiconductor material is Ag-doped $Hg_xCd_{1-x}Te$, wherein x is 0.19–0.3, 0.31–0.41, prepared by heating $Hg_xCd_{1-x}Te$ with Ag for 1–15 days at about 105–160° C., said external thermal perturbation is applied by heating for about 10–30 minutes at about 180–200° C., and self-restoration occurs by annealing for 0.5–100 days at about 20–80° C.

18. A semiconductor device according to claim 15, wherein said semiconductor material is Zn- or Be-doped InP, prepared by heating InP with Zn or Be for 10–60 minutes at about 540–600° C., when said external thermal perturbation is applied by heating for about 10–30 minutes at about 650–680° C., self-restoration occurs by annealing for 2–5 days at about 400–440° C.

19. A semiconductor device according to claim 15, wherein said semiconductor material is Zn-, Cd- or Be-doped GaAs, prepared by heating GaAs with Zn, Cd or Be for 30–60 minutes at about 600–700° C., when said external perturbation is applied by heating for about 20–40 minutes at about 700–800° C., self-restoration occurs by annealing for 3–5 days at about 450–550° C.

20. A semiconductor device according to claim 15, wherein the spatial distribution of the dopant at the p-n junction after perturbation and self-restoration is shifted with respect to its original position, thus creating an extra kinetically stabilized p-n junction.

21. A semiconductor device according to claim 15, wherein the spatial distribution of the dopant at the p-n junction after perturbation and self-restoration is identical to its original position, thus creating a fully stable p-n junction.

22. A semiconductor device comprising a body of a semiconductor material being of one of n- or p-type selected from the group consisting of GaAs, InP, $Hg_xCd_{1-x}Te$, wherein x is 0.19–0.3, 0.31–0.41, $Zn_xHg_{1-x}Te$ wherein x is 0.4–0.6, and $A_xB_{1-x}C$ wherein A and B are different elements selected from the group consisting of Al, Ga and In, C is As or Sb and x is 0 to 1, containing an electrically active dopant that creates an internal electric field selected from the group consisting of Ag, Be, Cd and Zn, said device being characterized by a stable p-n junction maintained by suppression of diffusion of said electrically active dopant by said internal electric field, and wherein self-restoration of the electrical properties of the said device occurs after being degraded by an external electrical or thermal perturbation or by perturbation with a photon or other particle beam.

23. A semiconductor device according to claim 22, wherein said external perturbation is thermal, heating occurs at a temperature above that used for preparing the doped semiconductor body, and self-restoration of said electric properties of the device occurs at a temperature below the temperature needed for the thermal perturbation, where the intrinsic electronic carrier concentration is at least two orders of magnitude below that of the electrically active dopants.

* * * * *